United States Patent
Tian et al.

(10) Patent No.: US 10,884,155 B2
(45) Date of Patent: Jan. 5, 2021

(54) METHOD AND APPARATUS FOR MEASURING OIL CONTENT OF TIGHT RESERVOIR BASED ON NUCLEAR MAGNETIC RESONANCE

(71) Applicant: PetroChina Company Limited, Beijing (CN)

(72) Inventors: Hua Tian, Beijing (CN); Shuichang Zhang, Beijing (CN); Shaobo Liu, Beijing (CN); Caineng Zou, Beijing (CN); Keyu Liu, Beijing (CN); Xuesong Lu, Beijing (CN); Mengjun Zhao, Beijing (CN); Lin Jiang, Beijing (CN); Xingzhi Ma, Beijing (CN); Bin Zhang, Beijing (CN); Junjia Fan, Beijing (CN); Peiqiang Yang, Beijing (CN)

(73) Assignee: PetroChina Company Limited, Beijing (CN)

( * ) Notice: Subject to any disclaimer, the term of this patent is extended or adjusted under 35 U.S.C. 154(b) by 226 days.

(21) Appl. No.: 16/157,480

(22) Filed: Oct. 11, 2018

(65) Prior Publication Data

US 2019/0113649 A1 Apr. 18, 2019

(30) Foreign Application Priority Data

Oct. 17, 2017 (CN) .......................... 2017 1 0965285
Sep. 17, 2018 (CN) .......................... 2018 1 1083381

(51) Int. Cl.
*G01N 24/08* (2006.01)
*G01R 33/483* (2006.01)
(Continued)

(52) U.S. Cl.
CPC ............. *G01V 3/32* (2013.01); *G01N 24/081* (2013.01); *G01R 33/31* (2013.01); *G01R 33/448* (2013.01);
(Continued)

(58) Field of Classification Search
CPC ... G01V 3/32; G01V 3/38; G01V 3/14; G01R 33/31; G01R 33/561; G01R 33/543;
(Continued)

(56) References Cited

U.S. PATENT DOCUMENTS 5,122,746 A * 6/1992 King .................... G01R 33/44
324/300
5,796,252 A * 8/1998 Kleinberg ................ G01V 3/32
324/303
(Continued)

FOREIGN PATENT DOCUMENTS

CN 101713754 A 5/2010
CN 102519999 A 6/2012
(Continued)

OTHER PUBLICATIONS

Tiwari, P.N., Gambhir, P.N. and Rajan, T.S., 1974. Rapid and nondestructive determination of seed oil by pulsed nuclear magnetic resonance technique. Journal of the American Oil Chemists' Society, 51(3), pp. 104-109. (Year: 1974).*
(Continued)

*Primary Examiner* — Christopher P McAndrew
(74) *Attorney, Agent, or Firm* — Michael Best and Friedrich LLP

(57) ABSTRACT

A method and an apparatus for measuring oil content of a tight reservoir based on nuclear magnetic resonance includes applying a pulse sequence to a tight reservoir rock, and after applying a first pulse and a last pulse in the pulse sequence, applying a gradient magnetic field to the tight reservoir rock,
(Continued)

respectively, directions of the two applied gradient magnetic fields being opposite to each other, wherein the pulse sequence is composed of three 90° pulses; acquiring a nuclear magnetic resonance signal of the tight reservoir rock; and determining oil content of the tight reservoir rock according to an intensity of the nuclear magnetic resonance signal. The method can accurately distinguish an oil phase nuclear magnetic resonance signal and a water phase nuclear magnetic resonance signal in nanopores of tight reservoir rock, thereby effectively improving the accuracy of the detection result of the oil content of the tight reservoir rock.

31 Claims, 14 Drawing Sheets

(51) Int. Cl.
*G01R 33/44* (2006.01)
*G01R 33/54* (2006.01)
*G01R 33/561* (2006.01)
*G01R 33/31* (2006.01)
*G01R 33/48* (2006.01)
*G01R 33/563* (2006.01)
*G01V 3/32* (2006.01)

(52) U.S. Cl.
CPC ....... *G01R 33/4831* (2013.01); *G01R 33/543* (2013.01); *G01R 33/561* (2013.01); *G01N 24/082* (2013.01); *G01R 33/4828* (2013.01); *G01R 33/56341* (2013.01)

(58) Field of Classification Search
CPC .............. G01R 33/448; G01R 33/4831; G01R 33/56341; G01R 33/4828; G01N 24/081; G01N 24/082
USPC ........................................................ 324/303
See application file for complete search history.

(56) References Cited

U.S. PATENT DOCUMENTS

| 6,023,163 | A * | 2/2000 | Flaum | G01V 3/32 |
| | | | | 324/300 |
| 6,497,139 | B1 * | 12/2002 | Locatelli | G01N 15/08 |
| | | | | 324/307 |
| 6,512,371 | B2 * | 1/2003 | Prammer | G01N 24/081 |
| | | | | 324/303 |
| 7,073,578 | B2 * | 7/2006 | Vinegar | E21B 36/008 |
| | | | | 166/245 |
| 7,463,027 | B2 * | 12/2008 | Prammer | G01V 3/32 |
| | | | | 324/303 |
| 8,004,279 | B2 * | 8/2011 | Kruspe | G01V 3/32 |
| | | | | 324/303 |
| 8,248,067 | B2 * | 8/2012 | Ong | G01F 1/74 |
| | | | | 324/303 |
| 10,466,381 | B2 * | 11/2019 | Coman | G01R 33/448 |
| 10,551,521 | B2 * | 2/2020 | Coman | G01R 33/56554 |
| 2017/0074852 | A1 * | 3/2017 | Nguyen | G01N 24/081 |
| 2017/0089849 | A1 | 3/2017 | Dai et al. | |
| 2018/0031732 | A1 * | 2/2018 | Mosse | G01V 99/005 |
| 2018/0321416 | A1 * | 11/2018 | Freedman | G01V 3/32 |

FOREIGN PATENT DOCUMENTS

| CN | 105188965 A | 12/2015 |
| CN | 105758883 A | 7/2016 |
| CN | 107015181 A | 8/2017 |

OTHER PUBLICATIONS

Steiner, S., et al. "Petrophysical Challenges in Unconventional and Tight Source Rocks, Onshore Abu Dhabi." Abu Dhabi International Petroleum Exhibition and Conference. Society of Petroleum Engineers, 2015. (Year: 2015).*
Chinese Search Report dated Sep. 12, 2017 (G1716217).
Chinese Patent Office Action and Search Report for counterpart Application No. 201811083381.9 dated Aug. 12, 2019 (11 pages, English translation included).
Zhonghua et al., "Enhanced diffusion theory of nuclear magnetic resonance (NMR) and its application to fluid identification of complex reservoirs," Petroleum Exploration and Development, 2010, 37(6):703-708.
Binge et al., "Study on reservoir classification based on NMR logging," Applied Science and Technology, 2015, (4):194-195 (statement of relevance included).

* cited by examiner

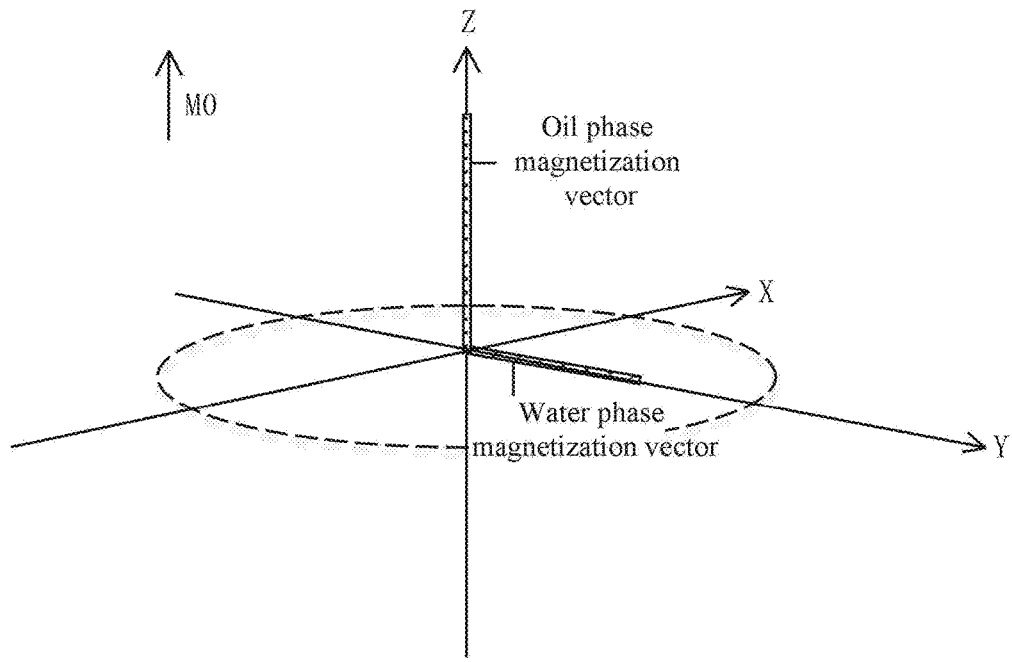

FIG. 11

Applying a third 90° pulse, so that the oil phase magnetization vector is turned from the direction of the initial magnetic field of the first axis to the second axis, and the water phase magnetization vector is turned from the second axis to the direction of the initial magnetic field of the first axis ⎯103a Applying a second gradient magnetic field to the tight reservoir rock for a third time duration, within a preset time period after the third 90° pulse is applied, so as to offset the first gradient magnetic field applied to the tight reservoir rock ⎯103b

FIG. 12

METHOD AND APPARATUS FOR MEASURING OIL CONTENT OF TIGHT RESERVOIR BASED ON NUCLEAR MAGNETIC RESONANCE

CROSS REFERENCES TO RELATED APPLICATIONS

The present invention contains subject matter related to Chinese Patent Application No.: 201710965285.6, filed Oct. 17, 2017 and Chinese Patent Application No.: 201811083381.9, filed Sep. 17, 2018, of which the entire contents are hereby incorporated by reference in the present application.

TECHNICAL FIELD

The present invention relates to the technical field of oil content measurement for reservoirs, in particular to a method and an apparatus for measuring oil content of a tight reservoir based on nuclear magnetic resonance.

BACKGROUND ART

The geophysical logging is to adopt various instruments to measure the physical parameters of the downhole rock formation and the technical conditions of the well, analyze the recorded data, and conduct the geological and engineering researches, in the process of exploration and production of oil, coal and metal ore bodies. With the continuous development of the Nuclear Magnetic Resonance (NMR) technology, the nuclear magnetic resonance logging technology has become one of the important geophysical logging methods, and it plays an important role in fluid property identification, pore structure evaluation and bound water content calculation.

At present, the nuclear magnetic resonance technology has been widely applied to aspects such as rock porosity, permeability and free fluid parameters in the petrophysics experiments, wherein there are two treatment methods for a rock sample containing both water and oil: (1) to add a water-soluble paramagnetic ion solution into a rock to shorten relaxation time of a water signal, so that the water signal is distinguished from an oil signal with longer relaxation time; this method has the disadvantages that it takes a long time to saturate the solution, the oil is highly volatile, it is difficult to completely saturate all the pores of the rock sample, it is possible to destroy the structure of the rock sample in the solution saturation process, and there are many error sources which lead to inaccurate measurement results; 2) to directly perform a rock detection without adding a solution, and the detection limit of lateral relaxation time (relaxation time $T_2$) in the existing nuclear magnetic resonance technology is about 6.7 ms. The above treatment methods can both achieve the micron-level pore detection, thereby measuring the oil content of the conventional reservoir rocks.

However, since the relaxation time of oil and water in the tight reservoir rock nanopores is superimposed and very short (i.e., the relaxation time $T_2$ is less than 6.7 ms, and particularly is 0.01 ms to 1 ms), the water phase signal and the oil phase signal influence each other. Therefore, neither of the above methods in the prior art is suitable for measuring the oil content in the tight reservoir rock nanopores, i.e., the methods for measuring the oil content in the prior art cannot distinguish the oil phase nuclear magnetic resonance signal and the water phase nuclear magnetic resonance signal in the nanopores from each other, and it is impossible to accurately detect the oil phase nuclear magnetic resonance signal in the nanopores (i.e., the oil phase nuclear magnetic resonance signal with the relaxation time $T_2$ less than 6.7 ms, and particularly is 0.01 ms to 1 ms).

SUMMARY OF THE INVENTION

With respect to the problems in the prior art, the present invention provides a method and an apparatus for measuring oil content of a tight reservoir based on nuclear magnetic resonance, which can accurately distinguish an oil phase nuclear magnetic resonance signal and a water phase nuclear magnetic resonance signal in tight reservoir rock nanopores from each other, thereby effectively improving the accuracy of the detection result of the oil content of the tight reservoir rock.

In order to solve the above technical problem, the present invention provides the following technical solutions:

In a first aspect, the present invention provides a method for measuring oil content of a tight reservoir based on nuclear magnetic resonance, comprising:

a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

acquiring a nuclear magnetic resonance signal of the tight reservoir rock; and determining oil content of the tight reservoir rock according to an intensity of the nuclear magnetic resonance signal.

In one embodiment, the pulse sequence and magnetic field application step comprises:

applying a first 90° pulse to the tight reservoir rock, and applying a first gradient magnetic field to the tight reservoir rock within a preset time period after the first 90° pulse is applied;

applying a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field;

applying a third 90° pulse when the oil phase magnetization vector is in the direction of the initial magnetic field and the water phase magnetization vector is turned from an opposite direction of the initial magnetic field of the first axis to the second axis, and applying a second gradient magnetic field to the tight reservoir rock within a preset time period after the third 90° pulse is applied, wherein the first and second gradient magnetic fields have a same intensity and opposite directions.

In one embodiment, applying a first 90° pulse to the tight reservoir rock, and applying a first gradient magnetic field to the tight reservoir rock within a preset time period after the first 90° pulse is applied comprises:

applying a first 90° pulse to the tight reservoir rock, so that the oil phase magnetization vector and the water phase magnetization vector are both turned from the opposite direction of the initial magnetic field of the first axis to a same direction of the second axis; and applying a first gradient magnetic field to the tight reservoir rock for a first time duration, within a preset time period after the first 90° pulse is applied, so that the oil phase magnetization vector and the water phase magnetization vector are rotated to positive and negative directions of the second axis, respectively.

In one embodiment, applying a second 90° pulse to the tight reservoir rock comprises:

applying a second 90° pulse to the tight reservoir rock and waiting for a second time duration, turning the oil phase magnetization vector and the water phase magnetization vector from the second axis to the direction of the initial magnetic field of the first axis and the opposite direction thereof, respectively, and then turning the water phase magnetization vector from the opposite direction of the initial magnetic field of the first axis to the second axis.

In one embodiment, applying a third 90° pulse, and applying a second gradient magnetic field to the tight reservoir rock within a preset time period after the third 90° pulse is applied comprises:

applying a third 90° pulse, so that the oil phase magnetization vector is turned from the direction of the initial magnetic field of the first axis to the second axis, and the water phase magnetization vector is turned from the second axis to the direction of the initial magnetic field of the first axis; and applying a second gradient magnetic field to the tight reservoir rock for a third time duration, within a preset time period after the third 90° pulse is applied, so as to offset the first gradient magnetic field applied to the tight reservoir rock.

In one embodiment, before determining oil content of the tight reservoir rock according to an intensity of the nuclear magnetic resonance signal, the method further comprises:

judging whether a type of the nuclear magnetic resonance signal is an echo signal;

if yes, determining that the nuclear magnetic resonance signal is an oil phase nuclear magnetic resonance signal.

In one embodiment, determining that the nuclear magnetic resonance signal is an oil phase nuclear magnetic resonance signal comprises:

if the nuclear magnetic resonance signal is an echo signal, determining that an oil phase magnetization vector corresponding to an oil phase substance in the current tight reservoir rock is turned from a second axis to a direction of an initial magnetic field, and then determining that the current nuclear magnetic resonance signal is an oil phase nuclear magnetic resonance signal, wherein the second axis is perpendicular to the direction of the initial magnetic field.

In one embodiment, the method for measuring the oil content of the tight reservoir based on nuclear magnetic resonance further comprises:

if the nuclear magnetic resonance signal is not an echo signal, determining that the nuclear magnetic resonance signal is composed of a water phase nuclear magnetic resonance signal and an oil phase nuclear magnetic resonance signal;

adjusting at least one of a first time duration, a second time duration, and a third time duration;

wherein, the first time duration is a persistent period of an application of a first gradient magnetic field to the tight reservoir rock, the second time duration is a time interval between a second 90° pulse and a third 90° pulse in the pulse sequence, and the third time duration is a persistent period of an application of a second gradient magnetic field to the tight reservoir rock, the first and second gradient magnetic fields having opposite directions;

and re-executing the pulse sequence and magnetic field application step based on at least one of the first time duration, the second time duration, and the third time duration having been adjusted.

In one embodiment, determining oil content of the tight reservoir rock according to an intensity of the nuclear magnetic resonance signal comprises:

acquiring oil content of the tight reservoir rock according to a relationship curve between the intensity of the oil phase nuclear magnetic resonance signal, a preset intensity of the nuclear magnetic resonance signal and the oil content.

In one embodiment, the relationship curve is pre-acquired in the steps of:

determining intensities of nuclear magnetic resonance signals and oil contents of a plurality of tight reservoir rocks with known oil contents linearly fitting the intensities of the nuclear magnetic resonance signals and the oil contents of the tight reservoir rocks, so as to acquire a relationship curve between the intensity of the nuclear magnetic resonance signal and the oil content.

In one embodiment, the first time duration is 0.01 ms to 6 ms.

In one embodiment, the second time duration is 1 ms to 10 ms.

In one embodiment, the third time duration is 0.01 ms to 6 ms.

In a second aspect, the present invention provides an apparatus for measuring oil content of a tight reservoir based on nuclear magnetic resonance, comprising:

a pulse sequence and magnetic field application module configured to execute a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

a nuclear magnetic resonance signal acquisition module configured to acquire a nuclear magnetic resonance signal of the tight reservoir rock; and a tight reservoir rock oil content determination module configured to determine oil content of the tight reservoir rock according to an intensity of the nuclear magnetic resonance signal.

In one embodiment, the pulse sequence and magnetic field application module comprises:

a first 90° pulse application unit configured to apply a first 90° pulse to the tight reservoir rock, and apply a first gradient magnetic field to the tight reservoir rock within a preset time period after the first 90° pulse is applied;

a second 90° pulse application unit configured to apply a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field;

a third 90° pulse application unit configured to apply a third 90° pulse when the oil phase magnetization vector is in the direction of the initial magnetic field and the water phase magnetization vector is turned from an opposite direction of the initial magnetic field of the first axis to the second axis, and apply a second gradient magnetic field to the tight reservoir rock within a preset time period after the third 90° pulse is applied, wherein the first and second gradient magnetic fields have a same intensity and opposite directions.

In one embodiment, the first 90° pulse application unit comprises:

a first pulse application subunit configured to apply a first 90° pulse to the tight reservoir rock, so that the oil phase magnetization vector and the water phase magnetization vector are both turned from the opposite direction of the initial magnetic field of the first axis to a same direction of the second axis;

a first gradient magnetic field application subunit configured to apply a first gradient magnetic field to the tight reservoir rock for a first time duration, within a preset time period after the first 90° pulse is applied, so that the oil phase magnetization vector and the water phase magnetization vector are rotated to positive and negative directions of the second axis, respectively.

In one embodiment, the second 90° pulse application unit comprises:

a second pulse application subunit configured to apply a second 90° pulse to the tight reservoir rock and waiting for a second time duration, turn the oil phase magnetization vector and the water phase magnetization vector from the second axis to the direction of the initial magnetic field of the first axis and the opposite direction thereof, respectively, and then turn the water phase magnetization vector from the opposite direction of the initial magnetic field of the first axis to the second axis.

In one embodiment, the third 90° pulse application unit comprises:

a third pulse application subunit configured to apply a third 90° pulse, so that the oil phase magnetization vector is turned from the direction of the initial magnetic field of the first axis to the second axis, and the water phase magnetization vector is turned from the second axis to the direction of the initial magnetic field of the first axis;

a second gradient magnetic field application subunit configured to apply a second gradient magnetic field to the tight reservoir rock for a third time duration, within a preset time period after the third 90° pulse is applied, so as to offset the first gradient magnetic field applied to the tight reservoir rock.

In one embodiment, the apparatus for measuring the oil content of the tight reservoir based on nuclear magnetic resonance further comprises:

a signal type judgment unit configured to judge whether a type of the nuclear magnetic resonance signal is an echo signal;

an oil phase nuclear magnetic resonance signal determination unit configured to determine that the nuclear magnetic resonance signal is an oil phase nuclear magnetic resonance signal, if the type of the nuclear magnetic resonance signal is an echo signal.

In one embodiment, the tight reservoir rock oil content determination module comprises:

an oil phase nuclear magnetic resonance signal determination unit configured to, if the nuclear magnetic resonance signal is an echo signal, determine that the oil phase magnetization vector corresponding to the oil phase substance in the current tight reservoir rock is turned from the second axis to the direction of the initial magnetic field, and then determine that the current nuclear magnetic resonance signal is an oil phase nuclear magnetic resonance signal;

wherein the second axis is perpendicular to the direction of the initial magnetic field.

In one embodiment, the apparatus for measuring the oil content of the tight reservoir based on nuclear magnetic resonance further comprises:

an oil and water mixed signal determination unit configured to, if the nuclear magnetic resonance signal is not an echo signal, determine that the nuclear magnetic resonance signal is composed of a water phase nuclear magnetic resonance signal and an oil phase nuclear magnetic resonance signal;

a time adjustment unit configured to adjust at least one of a first time duration, a second time duration, and a third time duration;

wherein, the first time duration is a persistent period of the application of the first gradient magnetic field to the tight reservoir rock, the second time duration is a time interval between the second 90° pulse and the third 90° pulse in the pulse sequence, and the third time duration is a persistent period of the application of the second gradient magnetic field to the tight reservoir rock, the first and second gradient magnetic fields having opposite directions;

a repeated application unit configured to re-execute the pulse sequence and magnetic field application step based on at least one of the first time duration, the second time duration, and the third time duration having been adjusted.

In one embodiment, the tight reservoir rock oil content determination module comprises:

a tight reservoir rock oil content acquiring unit configured to acquire oil content of the tight reservoir rock according to a relationship curve between the intensity of the oil phase nuclear magnetic resonance signal, a preset intensity of the nuclear magnetic resonance signal and the oil content.

In one embodiment, the apparatus for measuring the oil content of the tight reservoir based on nuclear magnetic resonance further comprises: a relationship curve pre-acquisition module configured to pre-acquire the relationship curve;

the relationship curve pre-acquisition module comprises:

a known data acquisition unit configured to determine intensities of nuclear magnetic resonance signals and oil contents of a plurality of tight reservoir rocks with known oil contents;

a liner fitting unit configured to linearly fit the intensities of the nuclear magnetic resonance signals and the oil contents of the tight reservoir rocks, so as to acquire a relationship curve between the intensity of the nuclear magnetic resonance signal and the oil content.

In one embodiment, the first time duration is 0.01 ms to 6 ms.

In one embodiment, the second time duration is 1 ms to 10 ms.

In one embodiment, the third time duration is 0.01 ms to 6 ms.

In a third aspect, the present invention provides an electronic device, comprising a memory, a processor, and a computer program stored in the memory and executable in the processor, wherein when executing the computer program, the processor realizes steps of a method for measuring oil content of a tight reservoir based on nuclear magnetic resonance, comprising:

a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

acquiring a nuclear magnetic resonance signal of the tight reservoir rock; and determining oil content of the tight reservoir rock according to an intensity of the nuclear magnetic resonance signal.

In a fourth aspect, the present invention provides a computer readable storage medium which stores a computer program, wherein when being executed by a processor, the computer program realizes steps of a method for measuring the oil content of the tight reservoir based on nuclear magnetic resonance, comprising:

a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

acquiring a nuclear magnetic resonance signal of the tight reservoir rock; and determining oil content of the tight reservoir rock according to an intensity of the nuclear magnetic resonance signal.

In a fifth aspect, the present invention provides a system for measuring the oil content of the tight reservoir based on nuclear magnetic resonance, comprising a control component, and a nuclear magnetic resonance spectrometer communicatively connected to the control component;

the nuclear magnetic resonance spectrometer is provided therein with a sample compartment that contains a tight reservoir rock;

the control component is configured to send a control signal to the nuclear magnetic resonance spectrometer;

the nuclear magnetic resonance spectrometer executes a pulse sequence and a magnetic field application step on the tight reservoir rock according to the control signal: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses; acquiring a nuclear magnetic resonance signal of the tight reservoir rock; sending the nuclear magnetic resonance signal to the control component;

the control component is further configured to determine oil content of the tight reservoir rock according to an intensity of the nuclear magnetic resonance signal.

In one embodiment, the control component is further configured to judge whether a type of the nuclear magnetic resonance signal is an echo signal; and if yes, determine that the nuclear magnetic resonance signal is an oil phase nuclear magnetic resonance signal, and determine the oil content of the tight reservoir rock according to the intensity of the oil phase nuclear magnetic resonance signal.

In one embodiment, the control component comprises a processor and a controller communicatively connected to each other;

the processor sends a control signal to the nuclear magnetic resonance spectrometer via the controller, receives a nuclear magnetic resonance signal sent by the nuclear magnetic resonance spectrometer, and judges whether a type of the nuclear magnetic resonance signal is an echo signal; if yes, determines that the nuclear magnetic resonance signal is an oil phase nuclear magnetic resonance signal, and determines the oil content of the tight reservoir rock according to the intensity of the oil phase nuclear magnetic resonance signal.

In one embodiment, the sample compartment comprises a rock receiving cavity configured to contain the tight reservoir rock, and an electromagnetic coil disposed outside the rock receiving cavity;

the electromagnetic coil is configured to apply the pulse sequence to the tight reservoir rock in the rock receiving cavity, and acquire a nuclear magnetic resonance signal of the tight reservoir rock.

In one embodiment, the sample compartment further comprises a temperature control component in communication with the rock receiving cavity and configured to change a temperature in the rock receiving cavity.

In one embodiment, the nuclear magnetic resonance spectrometer comprises a magnet configured to apply a gradient magnetic field to the tight reservoir rock.

As can be seen from the above technical solutions, the present invention provides a method and an apparatus for measuring oil content of a tight reservoir based on nuclear magnetic resonance, an electronic device, a storage medium, and a system for measuring oil content of a tight reservoir based on nuclear magnetic resonance, wherein the method for measuring the oil content of the tight reservoir based on nuclear magnetic resonance firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, detects the nuclear magnetic resonance signal of the tight reservoir rock, and determines the oil content of the tight reservoir rock according to the intensity of the oil phase nuclear magnetic resonance signal, thereby effectively improving the accuracy of the detection result of the oil content of the tight reservoir rock.

BRIEF DESCRIPTION OF THE DRAWINGS

In order to more clearly describe the technical solutions in the embodiments of the present application or in the prior art, the drawings to be used in the descriptions of the embodiments or the prior art will be briefly introduced as follows. Obviously, the drawings in the following descriptions just illustrate some embodiments of the present application, and those skilled in the art can obtain other drawings from them without paying any creative effort.

FIG. 11 is a schematic diagram in which a water phase magnetization vector is in a process of recovery to a positive direction of axis Z and in a positive direction of axis Y after a second time period in an embodiment of the present invention;

FIG. 12 is a schematic flow chart of step 103 of a method for measuring oil content of a tight reservoir in an embodiment of the present invention;

DETAILED DESCRIPTION OF THE PREFERRED EMBODIMENTS

Figure 1A:
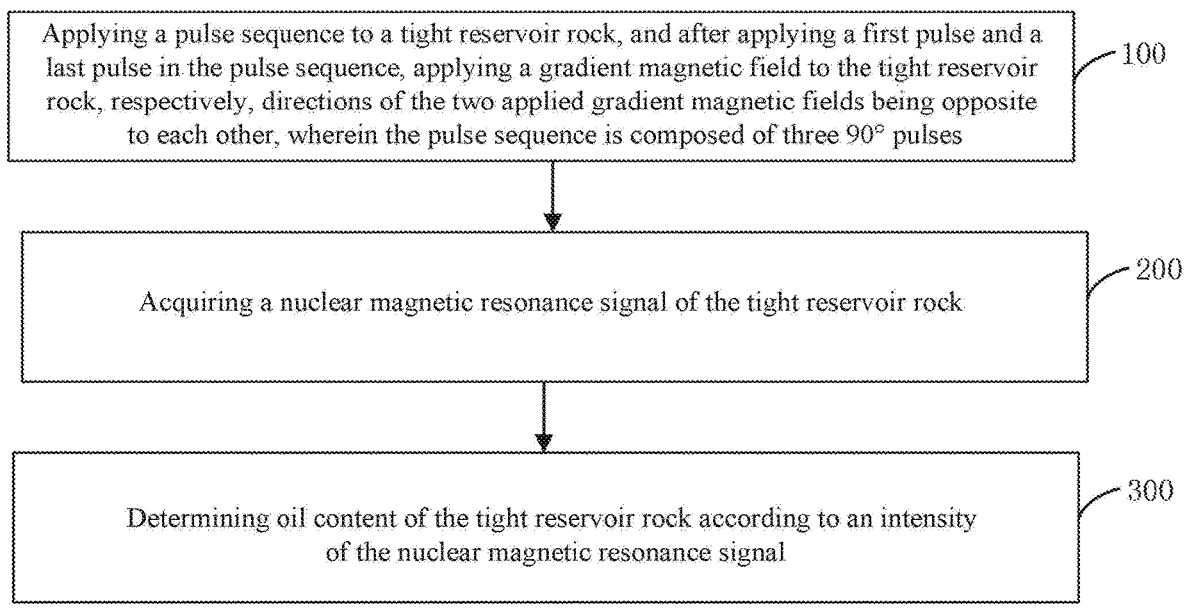
FIG. 1A is a schematic flow chart of a method for measuring oil content of a tight reservoir based on nuclear magnetic resonance in an embodiment of the present invention.

In order that the objectives, technical solutions and advantages of the embodiments of the present invention are clearer, the technical solutions in the embodiments of the present invention are clearly and completely described below in conjunction with the drawings in the embodiments of the present invention. Obviously, those described are merely a part, rather than all, of the embodiments of the present invention. Any other embodiment obtained by those skilled in the art based on the embodiments of the present invention without paying any creative effort should fall within the protection scope of the present invention.

With respect to the problem in the prior art that an oil phase magnetic resonance signal and a water phase nuclear magnetic resonance signal in a tight reservoir rock cannot be distinguished from each other, the embodiments of the present application provide a method for measuring oil content of a tight reservoir based on nuclear magnetic resonance, which adds a diffusion dimension on the basis of the relaxation dimension (the diffusion refers to an irregular thermal motion of molecules, i.e., Brownian motion; and the diffusion in nuclear magnetic resonance generally refers to a phenomenon in which oil/water molecules continuously and randomly change the motion directions and positions; a velocity of molecular diffusion is called as a diffusion coefficient, and the oil/water molecules have different diffusion coefficients; by applying certain conditions, a difference will be produced between the oil and water signals in terms of the diffusion dimension); by using the diffusion relaxation characteristics difference between the oil phase and the water phase in the tight reservoir rock, and by applying a gradient magnetic field, the water phase nuclear magnetic resonance signal is rapidly attenuated to zero by specific pulses and gradients, while the oil phase nuclear magnetic resonance signal is retained; next, specific pulses and gradients are applied to recover the oil phase nuclear magnetic resonance signal; since the influence of the water phase is excluded, the embodiments of the present application can achieve a collection of an oil nuclear magnetic resonance signal with the relaxation time $T_2$ less than 6.7 ms, especially is 0.01 ms to 1 ms, so as to avoid the mutual influence between the short relaxation oil and water signals in the nanopores, and effectively detect the oil phase nuclear magnetic resonance signal in the nanopores, thereby acquiring more accurate oil content of the tight reservoir rock, and avoiding the problem of a high measured value of the oil content due to the influence of the water phase.

Among the elements contained in the formation, the hydrogen nuclei have the largest gyromagnetic ratio and a high abundance, while fluids (i.e., water and oil) in the formation rock contain a lot of hydrogen nuclei, so the hydrogen nuclei can be taken as the research object. The relaxation properties of the fluids in the rock can be acquired by detecting the relaxation characteristics of the hydrogen nuclei. In general, the nuclear magnetic resonance relaxation mechanisms can be classified into particle surface relaxation, molecular diffusion relaxation and volume relaxation. In which, (1) Particle surface relaxation: the molecules constantly move and diffuse in the pore space; during NMR measurement, the diffusion gives the molecules an adequate opportunity to collide with the particle surfaces, and each collision provides an opportunity for spin relaxation. During the collision of the molecules, there may be two situations: the hydrogen nuclei transfer the spin energy to the particle surfaces so that they are rearranged in a direction of the static magnetic field, thereby influencing the longitudinal relaxation time $T_1$; or the protons irreversibly lose phases, thereby contributing to the transverse relaxation time $T_2$. Of course, these phenomena do not happen in each collision, and there is only a possibility. Therefore, the probability of particle surface relaxation increases with the probability of collision.

(2) Volume relaxation: for water and hydrocarbon, the volume relaxation is mainly due to a local magnetic field fluctuation caused by the random motion of adjacent spin nuclei. The volume relaxation is very important when a fluid is prevented from coming into contact with the particle surface. (3) Diffusion relaxation: in a gradient magnetic field, the relaxation caused by a molecular diffusion is called as a diffusion relaxation. In the gradient magnetic field, the molecular motion causes the phase loss, which influences $T_2$ relaxation, rather than $T_1$ relaxation. The gradient magnetic field is mainly produced due to the magnetic field inhomogeneity, or the difference between the magnetic susceptibilities of the particulate matter and the pore fluid. The influence of diffusion can be ignored for the pulse sequences with small echo time. It can be seen that the diffusion relaxation has important applications in the diffusion coefficient measurement and the oil-water distinction.

In addition, the particle surface relaxation in most rocks is the main factor influencing $T_1$ and $T_2$. In the particle surface relaxation, the pore size determines the relaxation rate. In the large pores, the number of collisions is small, so the relaxation time is long; while in the small pores, the number of collisions increases, and the relaxation time is shortened; thus, the relaxation time is proportional to the surface volume ratio of the rock. The pore size of the reservoir rock is inversely proportional to the relaxation rate of the hydrogen nuclei, and if the relaxation time characteristics of the fluid distribution in the rock are measured, the fluid content and distribution in the pores of the rock can be determined. Therefore, the nuclear magnetic resonance $T_2$ spectrum reflects the pore structure characteristics of the rock to some extent, wherein the rock surface relaxation can be expressed with the following Equation 1:

$$\frac{1}{T_2} = \rho_2 \frac{S}{V} \qquad \text{Equation 1}$$

wherein, the relaxation time $T_2$ is inversely proportional to a pore radius; a proportionality coefficient $\rho_2$ represents a surface relaxation rate in a unit of μm/ms; S represents a surface area of a rock pore; V represents a volume of the rock pore; and $$\frac{S}{V}$$

represents a pore specific surface, in a unit of $\mu m^{-1}$.

The first 90° pulse, the second 90° pulse, and the third 90° pulse appearing in the embodiments of the present Specification are pulses having a sequential execution order in a unit pulse sequence. The first 90° pulse, the second 90° pulse, and the third 90° pulse are hard pulses with the same pulse width. In which, the Radio Frequency (RF) magnetic field system in the Magnetic Resonance Imaging (MRI) emits radio frequency electromagnetic waves with a central frequency of Larmor frequency, which excites the proton group of the sample to produce the nuclear magnetic resonance effect. The electromagnetic waves are not in a single frequency, but in a frequency band having a certain width with the Larmor frequency as the center frequency. The radio frequency electromagnetic waves can be classified into hard pulse and soft pulse depending on the frequency bandwidth. The radio frequency pulse is a time-gated high frequency carrier signal, which is a time domain signal. The carrier frequency is the Larmor frequency generated by the frequency source and is a signal of a single frequency. The gating signal pulse sequence generator generates a signal that controls the radio frequency transmission timing. The hard pulse has a narrow time excitation width, but the radio frequency amplitude is high, and the corresponding frequency band is wide, which can excite a large range of protons.

A first time duration, a second time duration, and a third time duration appearing in the embodiments of the present Specification are only used for distinguished expressions, and there is no specific ordinal relationship between them.

In which, the first time duration is a persistent period of the application of the first gradient magnetic field to the tight reservoir rock; further, the first time duration may be a time duration for the oil phase magnetization vector, which is corresponding to the oil phase substance, and the water phase magnetization vector, which is corresponding to the water phase substance, in the tight reservoir rock to be located in the positive and negative directions of the second axis from the same direction of the second axis, and can be acquired based on experimental experiences. Generally, the first time duration may range from 0.01 ms to 6 ms.

The second time duration is a waiting time after the second 90° pulse is applied to the tight reservoir rock, i.e., a time interval between the applications of the second 90° pulse and the third 90° pulse; meanwhile, it is also a time duration for the water phase magnetization vector to be turned from an opposite direction of the initial magnetic field of the first axis to the second axis. Generally, the second time duration may range from 1 ms to 10 ms.

The third time duration is a persistent period of the application of the second gradient magnetic field to the tight reservoir rock. Since the first and second gradient magnetic fields have the opposite directions and the same intensity, the third time duration may be equal to the first time duration, the third time duration may be equal to the first time duration. If the first time duration is the half-echo time of the first 90° pulse, the third time duration is the half-echo time of the third 90° pulse. Generally, the third time duration may range from 0.01 ms to 6 ms.

In the embodiment of the present Specification, the first gradient magnetic field is a gradient magnetic field applied to the tight reservoir rock within a preset time period after the first 90° pulse is applied, and the second gradient magnetic field is a gradient magnetic field applied to the tight reservoir rock within a preset time period after the third 90° pulse is applied. In order to offset the first gradient magnetic field applied to the tight reservoir rock, the first and second gradient magnetic fields have a same intensity and opposite directions.

Based on the content, the embodiments of the present invention provide implementations of a method for measuring oil content of a tight reservoir based on nuclear magnetic resonance. Referring to FIG. 1A, the method for measuring oil content of a tight reservoir based on nuclear magnetic resonance specifically comprises:

Step 100: a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses.

In step 100, a first gradient magnetic field is applied after applying a first 90° pulse of the current pulse sequence, and a second gradient magnetic field is applied after applying a third 90° pulse of the current pulse sequence.

It can be understood that before the pulse sequence is applied, under the effect that a direction of an initial magnetic field is the same as a certain direction of an initial axis, hydrogen protons of the fluid in the tight reservoir rock are excited to be subjected to a Larmor precession around the initial axis, so that the oil phase magnetization vector and water phase magnetization vector are both located on the initial axis in the direction of the initial magnetic field.

Figure 2:
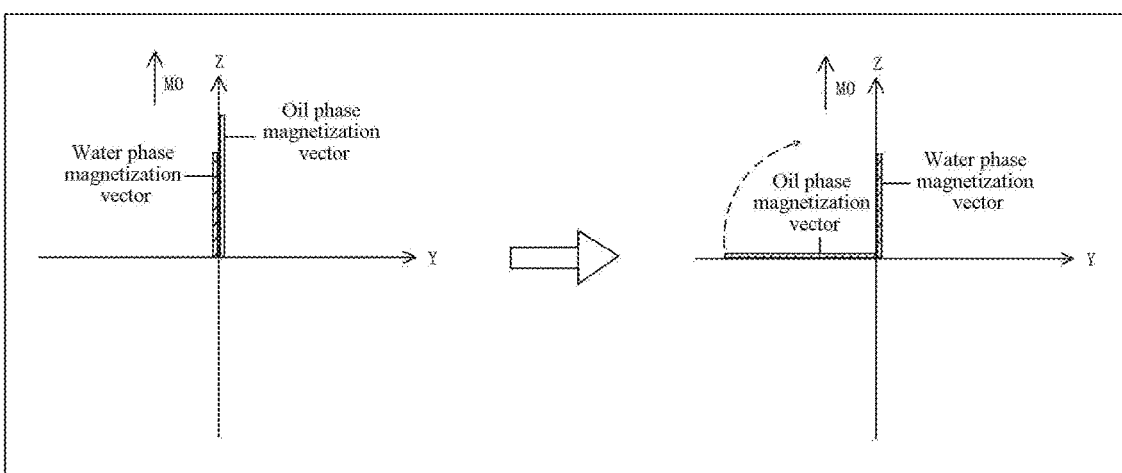
FIG. 2 is a schematic logic diagram of a separation between an oil phase magnetization vector and a water phase magnetization vector in a tight reservoir rock in an embodiment of the present invention.

The function of step 100 in this embodiment is to separate the oil phase magnetization vector from the water phase magnetization vector. For example, referring to FIG. 2, if the direction of the initial magnetic field is as shown by M0, the function of step 100 is to transfer an initial state in which the oil phase magnetization vector and the water phase magnetization vector are both in a positive direction of axis Z, into a state in which the water phase magnetization vector is still in the positive direction of axis Z while the oil phase magnetization vector is in a positive or negative direction of axis Y. At that time, the water phase magnetization vector is already in a stable state, while the oil phase magnetization vector returns to the positive direction of axis Z from axis Y by means of spinning under the effect of the initial magnetic field M0. On this basis, during the motion of the oil phase magnetization vector from axis Y to axis Z, the oil phase magnetization vector cuts the magnetic induction line to generate a signal. The signal detected at that time is only an oil phase nuclear magnetic resonance signal corresponding to the oil phase magnetization vector, thereby achieving the separation of the oil phase magnetization vector from the water phase magnetization vector.

Step 200: acquiring a nuclear magnetic resonance signal of the tight reservoir rock.

Step 300: determining oil content of the tight reservoir rock according to an intensity of the nuclear magnetic resonance signal.

Figure 1B:
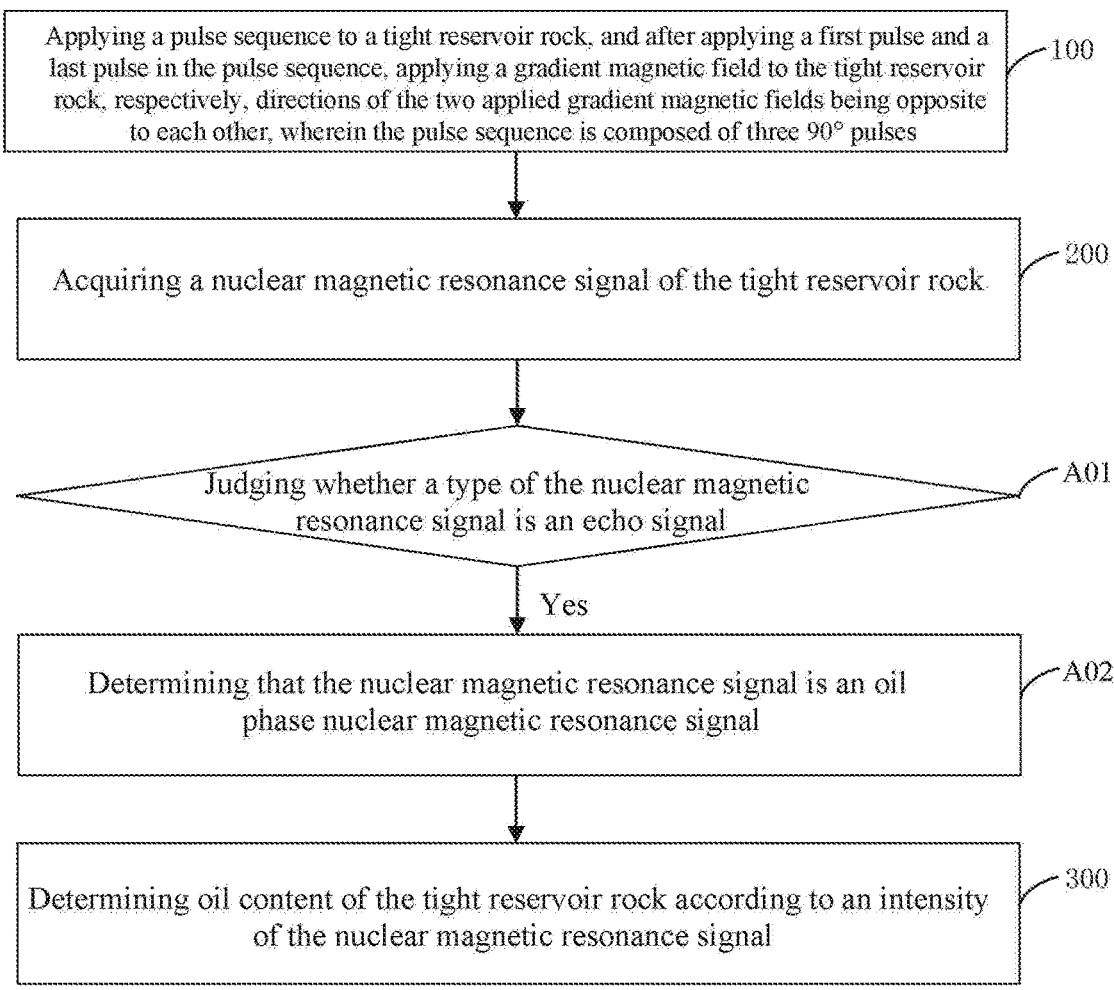
FIG. 1B is a schematic flow chart of a method for measuring oil content of a tight reservoir based on nuclear magnetic resonance including steps A01 and A02 in an embodiment of the present invention.

In one implementation, referring to FIG. 1B, steps A01 and A02 may be further comprised between steps 200 and 300, and they specifically comprise:

step A01: judging whether a type of the nuclear magnetic resonance signal is an echo signal, and if yes, executing step A02;

step A02: determining that the nuclear magnetic resonance signal is an oil phase nuclear magnetic resonance signal.

In steps A01 and A02, after the pulse sequence is applied, the nuclear magnetic resonance signal of the tight reservoir rock is collected, and it is judged whether the type of the nuclear magnetic resonance signal is an echo signal. It can be understood that the function of the judgment herein is to confirm whether the current nuclear magnetic resonance signal is only an oil phase nuclear magnetic resonance signal. That is, the effect of the judgment herein is to detect whether the application of the second gradient magnetic field offsets the initially applied magnetic field. If the type of the nuclear magnetic resonance signal is an echo signal, it can be determined that the first and second gradient magnetic fields offset each other. In addition, based on the separation of the oil phase magnetization vector from the water phase magnetization vector realized in step 100, it can be determined that the nuclear magnetic resonance signal is an oil phase nuclear magnetic resonance signal.

In step 300, determining oil content of the tight reservoir rock according to an intensity of the nuclear magnetic resonance signal specifically may comprise: acquiring the oil content of the tight reservoir rock according to the intensity of the oil phase nuclear magnetic resonance signal and a curve of relationship between a preset intensity of the nuclear magnetic resonance signal and the oil content.

As can be seen from the above description, the method for measuring the oil content of the tight reservoir provided by the embodiments of the present invention firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, determines whether the applied gradient magnetic field is offset by detecting the nuclear magnetic resonance signal of the tight reservoir rock and judging whether the type of the nuclear magnetic resonance signal is an echo signal, so as to improve the accuracy and reliability of acquisition of the oil phase nuclear magnetic resonance signal; and finally, if the nuclear magnetic resonance signal is an echo signal, determines that the nuclear magnetic resonance signal is only the oil phase nuclear magnetic resonance signal, and determines the oil content of the tight reservoir rock according to the intensity of the oil phase nuclear magnetic resonance signal, thereby effectively improving the accuracy of the detection result of the oil content of the tight reservoir rock.

Figure 3:
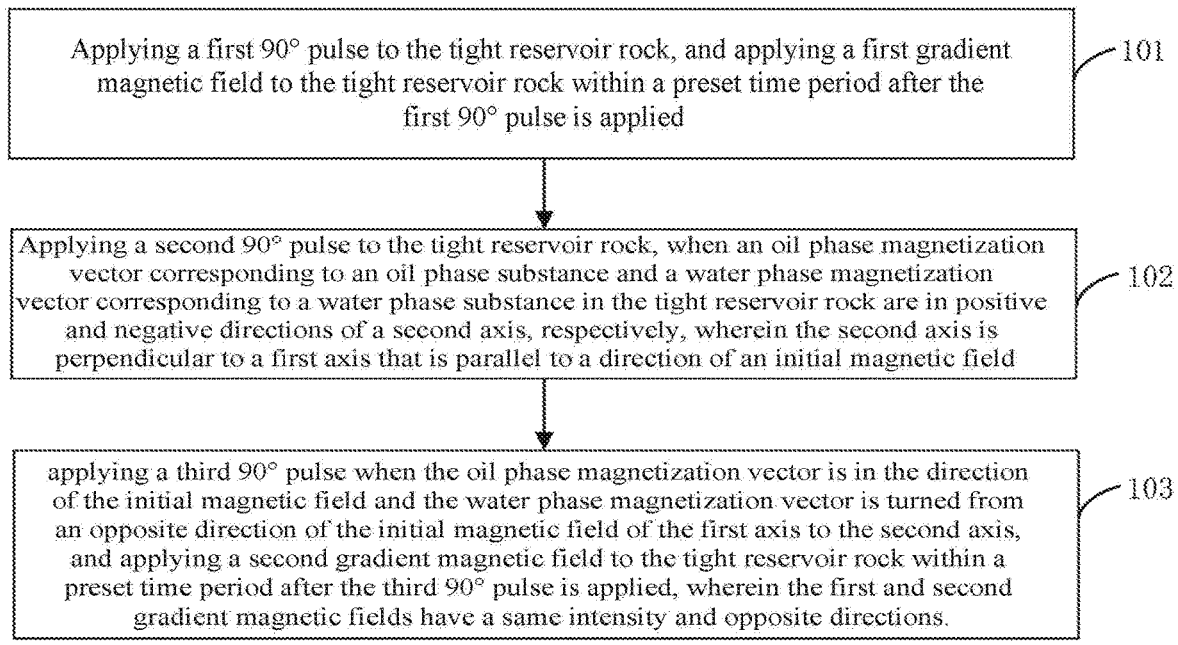
FIG. 3 is a schematic flow chart of step 100 of a method for measuring oil content of a tight reservoir in an embodiment of the present invention.

In one implementation, referring to FIG. 3, step 100 of the method for measuring the oil content of the tight reservoir in the present invention specifically comprises:

step 101: applying a first 90° pulse to the tight reservoir rock, and applying a first gradient magnetic field to the tight reservoir rock within a preset time period after the first 90° pulse is applied;

step 102: applying a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field.

step 103: applying a third 90° pulse when the oil phase magnetization vector is in the direction of the initial magnetic field and the water phase magnetization vector is turned from an opposite direction of the initial magnetic field of the first axis to the second axis, and applying a second gradient magnetic field to the tight reservoir rock within a preset time period after the third 90° pulse is applied, wherein the first and second gradient magnetic fields have a same intensity and opposite directions.

Figure 4:
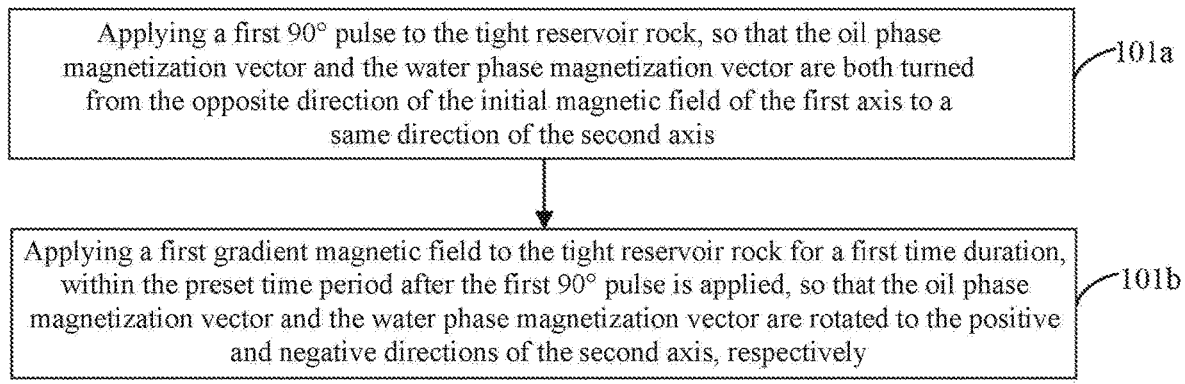
FIG. 4 is a schematic flow chart of step 101 of a method for measuring oil content of a tight reservoir in an embodiment of the present invention.

In one implementation of step 101 of the method for measuring the oil content of the tight reservoir, referring to FIG. 4, step 101 specifically comprises:

Step 101*a*: applying a first 90° pulse to the tight reservoir rock, so that the oil phase magnetization vector and the water phase magnetization vector are both turned from the opposite direction of the initial magnetic field of the first axis to a same direction of the second axis.

Figure 5:
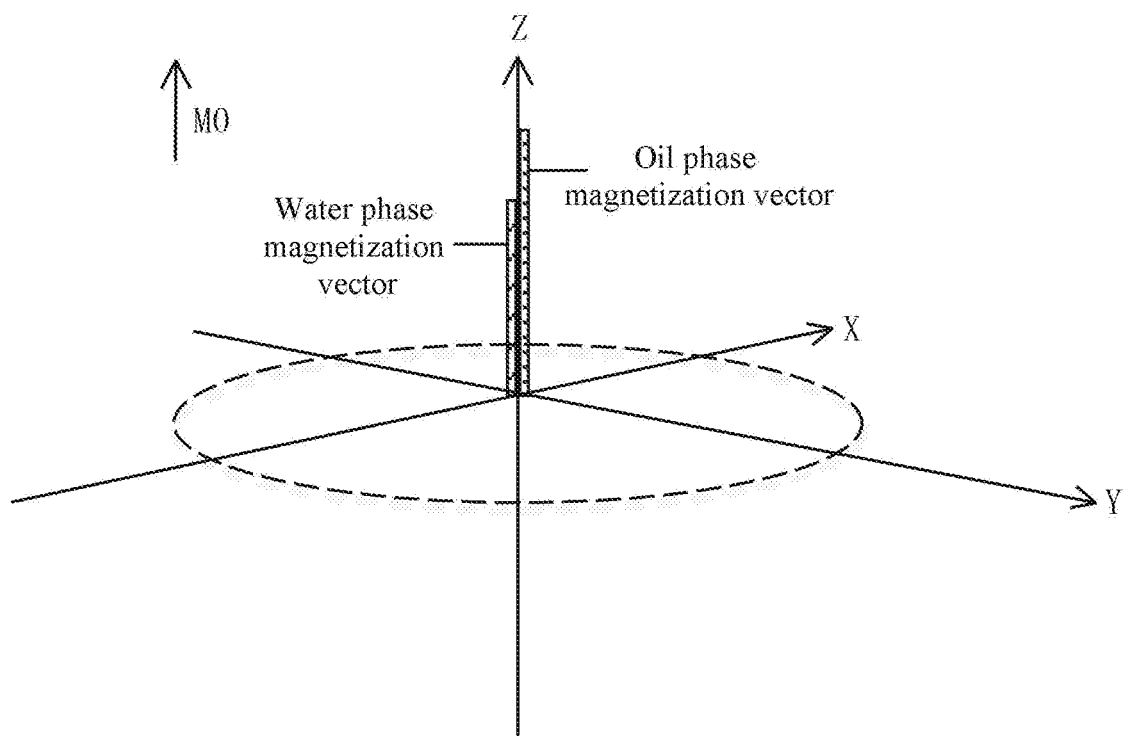
FIG. 5 is a schematic diagram in which initial states of an oil phase magnetization vector and a water phase magnetization vector are both in a positive direction of axis Z in an embodiment of the present invention.
Figure 6:
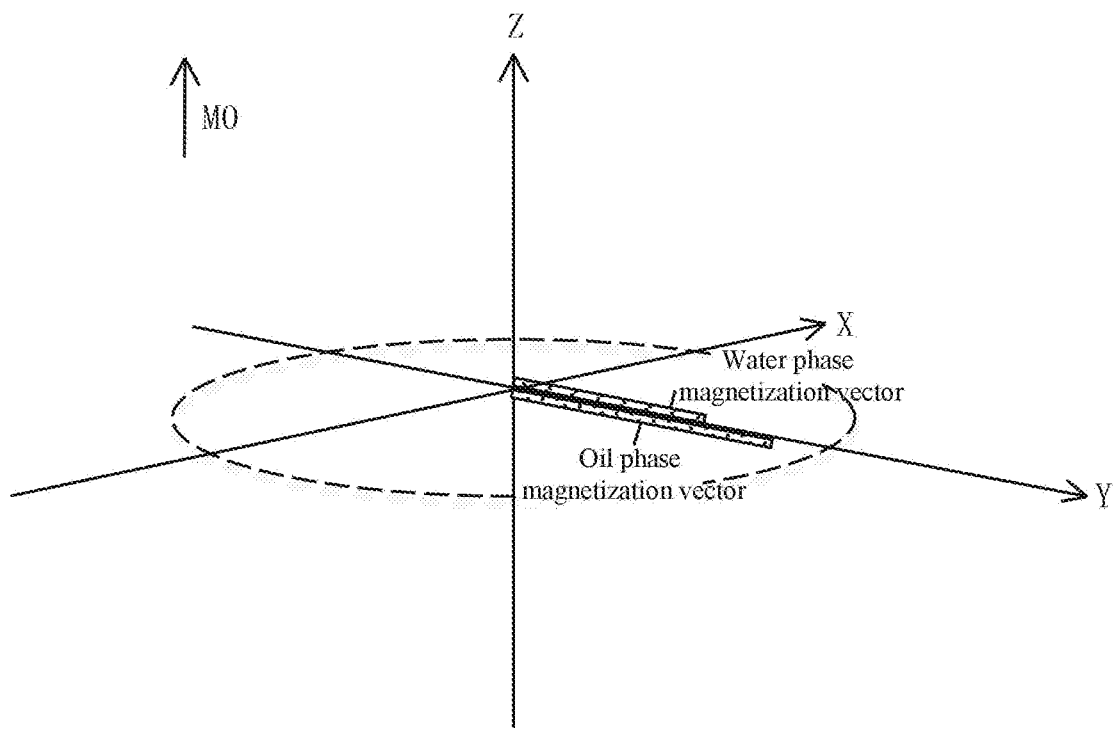
FIG. 6 is a schematic diagram in which an oil phase magnetization vector and a water phase magnetization vector are both turned to a positive direction of axis Y after a first 90° pulse is applied in an embodiment of the present invention.

For example, if the direction of the initial magnetic field M0 is the same as the positive direction of axis Z, the oil phase magnetization vector and the water phase magnetization vector in the tight reservoir rock are both in an initial state of being in the positive direction of axis Z, as shown in FIG. 5. Next, a first 90° pulse is applied to the tight reservoir rock, and if the positive direction from axis Z to axis Y is taken as the application direction of the 90° pulse, the oil phase magnetization vector and the water phase magnetization vector are both turned from the positive direction of axis Z to a same direction of axis Y, as shown in FIG. 6. In this example, the oil phase magnetization vector and the water phase magnetization vector are both turned to the positive direction of axis Y.

Step 101*b*: applying the first gradient magnetic field to the tight reservoir rock for a first time duration, within the preset time period after the first 90° pulse is applied, so that the oil phase magnetization vector and the water phase magnetization vector are rotated to positive and negative directions of the second axis, respectively.

It can be understood that the preset time period can be set based on the specific application situations, and the specific value may range from 0.01 ms to 10 ms.

Figure 7:
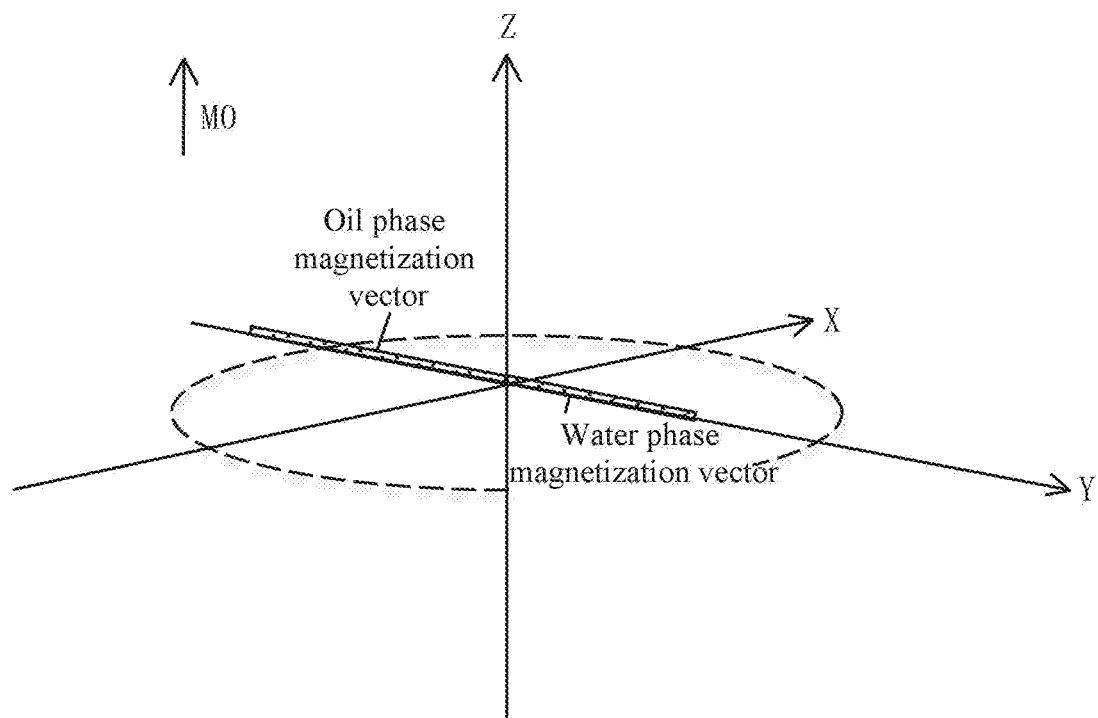
FIG. 7 is a schematic diagram in which a water phase magnetization vector is in a positive direction of axis Y and an oil phase magnetization vector is in a negative direction of axis Y after a first gradient magnetic field is applied in an embodiment of the present invention.
Figure 8:
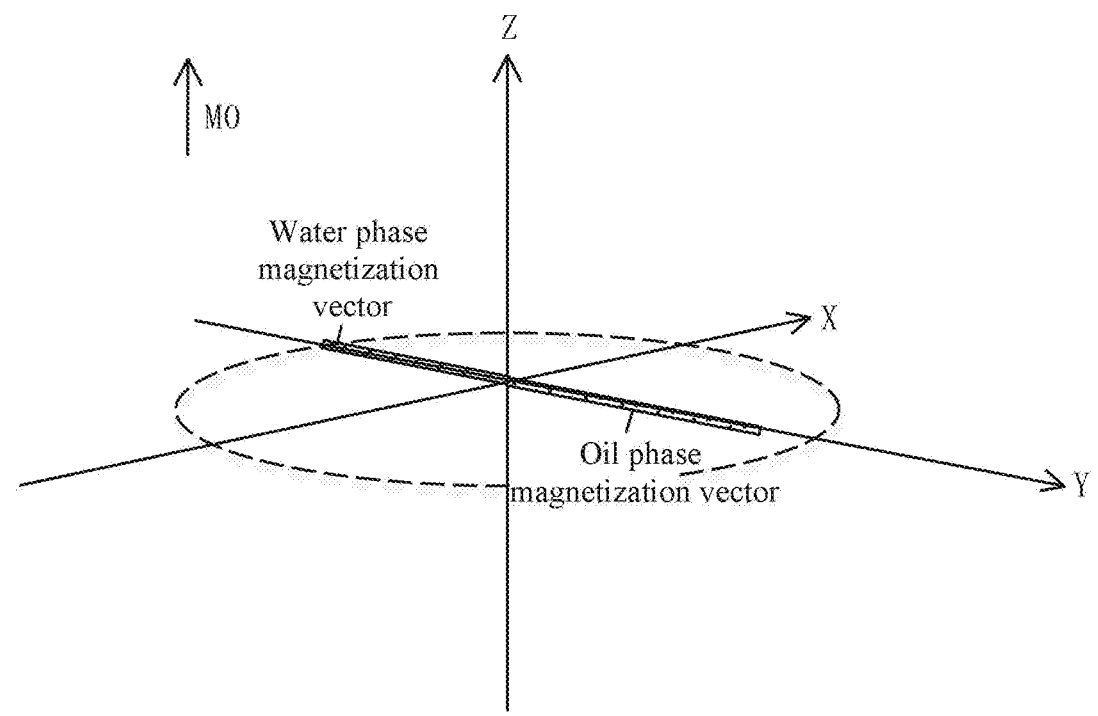
FIG. 8 is a schematic diagram in which a water phase magnetization vector is in a negative direction of axis Y and an oil phase magnetization vector is in a positive direction of axis Y after a first gradient magnetic field is applied in an embodiment of the present invention.

For example, if the direction of the initial magnetic field M0 is the same as the positive direction of axis Z, the oil phase magnetization vector and the water phase magnetization vector begin to recover to their respective equilibrium states under the effect of the initial magnetic field M0, when the first 90° pulse is applied and the oil phase magnetization vector and the water phase magnetization vector are both turned from the positive direction of axis Z to a same direction of axis Y, and this recovery process forms a Free Induction Decay (FID). At that time, the oil phase magnetization vector and the water phase magnetization vector are both rotated around axis Z in plane XY, which is a diffusion process. Since the oil phase substance and the water phase substance have different diffusion coefficients (the diffusion coefficient of the water phase substance is greater than that of the oil phase substance, generally reaching a difference at an order of magnitude), during the recoveries of the oil phase magnetization vector and the water phase magnetization vector to their equilibrium states, the diffusion velocity of the water phase magnetization vector is higher than that of the oil phase magnetization vector. In order to increase the diffusion velocity difference between the water phase magnetization vector and the oil phase magnetization vector, the first gradient magnetic field is applied to the tight reservoir rock for a second time duration in step 101*b*, so that the diffusion velocity difference between the water phase magnetization vector and the oil phase magnetization vector is increased, and the water phase magnetization vector and the oil phase magnetization vector are rotated to the positive and negative directions of axis Y, respectively, when being rotated on plane XY, as shown in FIGS. 7 and 8, wherein in FIG. 7, the water phase magnetization vector is in the positive direction of axis Y, and the oil phase magnetization vector is in the negative direction of axis Y; and in FIG. 8, the water phase magnetization vector is in the negative direction of axis Y, and the oil phase magnetization vector is in the positive direction of axis Y.

In one implementation of step 102 of the method for measuring the oil content of the tight reservoir, step 102 specifically comprises:

Step 102*a*: applying a second 90° pulse to the tight reservoir rock and waiting for a second time duration, turning the oil phase magnetization vector and the water phase magnetization vector from the second axis to the direction of the initial magnetic field of the first axis and the opposite direction thereof, respectively, and then turning the water phase magnetization vector from the opposite direction of the initial magnetic field of the first axis to the second axis.

For example, if the direction of the initial magnetic field M0 is the same as the positive direction of axis Z, a second 90° pulse is applied to the tight reservoir rock and a second time duration is waited for when the water phase magnetization vector and the oil phase magnetization vector are rotated to positive and negative directions of axis Y, respectively, so that the water phase magnetization vector and the oil phase magnetization vector in the positive and negative directions of axis Y are turned to positive and negative directions of axis Z, respectively, and the specific turning direction is related to the application direction of the second 90° pulse. The detailed situations are described as follows.

Figure 9:
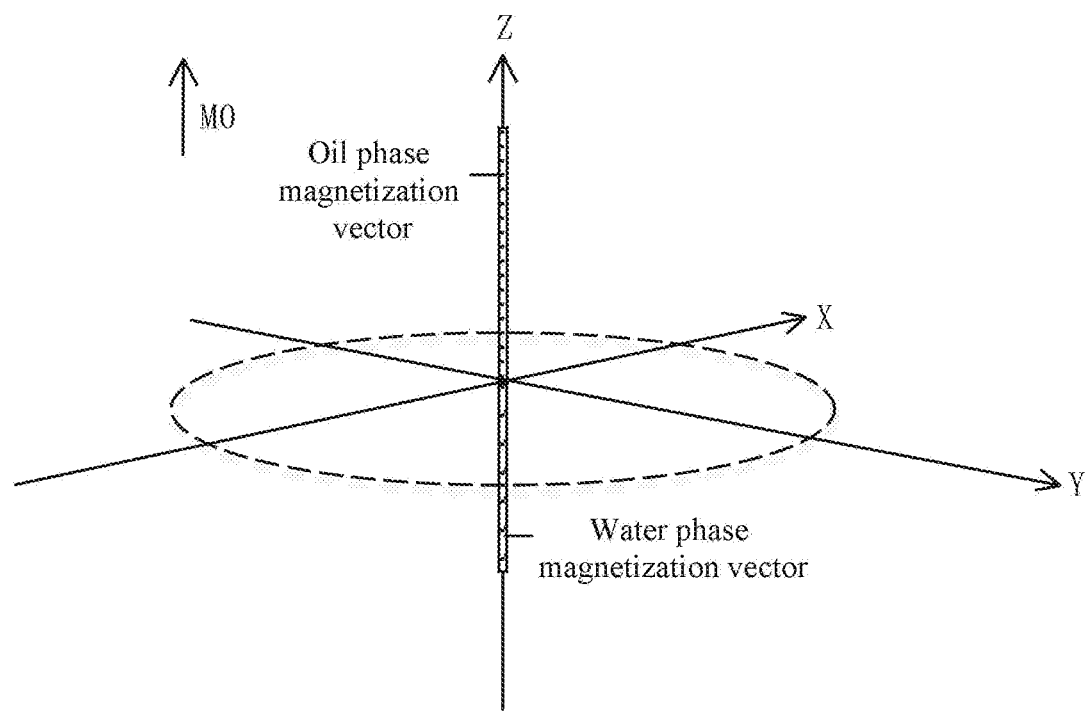
FIG. 9 is a schematic diagram in which a water phase magnetization vector is turned to a negative direction of axis Z and an oil phase magnetization vector is turned to a positive direction of axis Z after a second 90° pulse is applied in an embodiment of the present invention.
Figure 10:
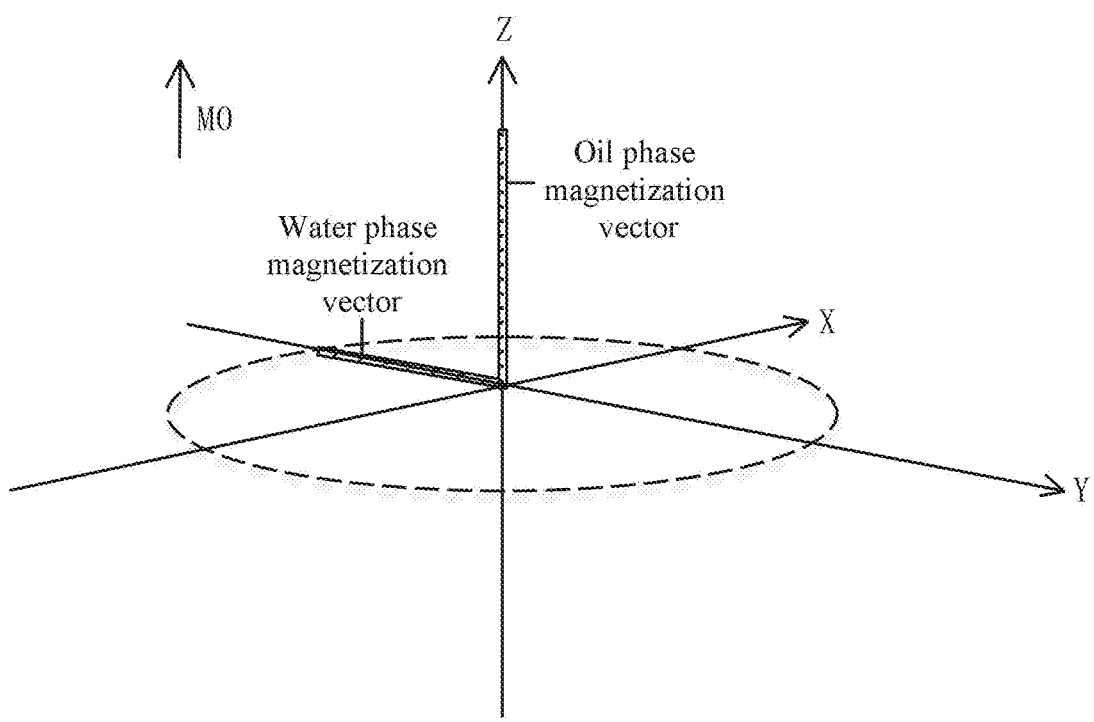
FIG. 10 is a schematic diagram in which a water phase magnetization vector is in a process of recovery to a positive direction of axis Z and in a negative direction of axis Y after a second time period in an embodiment of the present invention.

Situation 1: currently, the water phase magnetization vector is in the negative direction of axis Y, and the oil phase magnetization vector is in the positive direction of axis Y; then a second 90° pulse is applied to the tight reservoir rock from the negative direction of axis Y to the negative direction of axis Z, i.e., the application direction of the second 90° pulse is opposite to that of the first 90° pulse, so that the water phase magnetization vector is turned to the negative direction of axis Z, and the oil phase magnetization vector is turned to the positive direction of axis Z, as shown in FIG. 9. Next, the water phase magnetization vector is recovered to the equilibrium state in the positive direction of axis Z. A second time duration is waited for in this time period, so that the water phase magnetization vector is located in axis Y in a process of recovery to the positive direction of axis Z, as shown in FIG. 10 or FIG. 11, wherein in FIG. 10, the water phase magnetization vector is located in the negative direction of axis Y in a process of recovery to the positive direction of axis Z; and in FIG. 11, the water phase magnetization vector is located in the positive direction of axis Y in a process of recovery to the positive direction of axis Z.

Situation 2: currently, the water phase magnetization vector is in the positive direction of axis Y, and the oil phase magnetization vector is in the negative direction of axis Y; then a second 90° pulse is applied to the tight reservoir rock from the positive direction of axis Y to the negative direction of axis Z, i.e., the application direction of the second 90° pulse is opposite to that of the first 90° pulse, so that the oil phase magnetization vector is turned upward to the positive direction of axis Z, and the water phase magnetization vector is turned downward to the negative direction of axis Z, as shown in FIG. 9. Next, the water phase magnetization vector is recovered to the equilibrium state in the positive direction of axis Z. A second time duration is waited for in this time period, so that the water phase magnetization vector is located in axis Y in a process of recovery to the positive direction of axis Z, as shown in FIG. 10 or FIG. 11.

It can be understood that in the above process, since the oil phase magnetization vector is in the positive direction of axis Z, and the direction of the initial magnetic field M0 is the same as the positive direction of axis Z, the oil phase magnetization vector already in the equilibrium state. Thus, within the second time duration between the applications of the second 90° pulse and the third 90° pulse, only the water phase magnetization vector is recovered to the equilibrium state of the positive direction of axis Z.

In one implementation of step 103 of the method for measuring the oil content of the tight reservoir, referring to FIG. 12, step 103 specifically comprises:

Step 103*a*: applying a third 90° pulse, so that the oil phase magnetization vector is turned from the direction of the initial magnetic field of the first axis to the second axis, and the water phase magnetization vector is turned from the second axis to the direction of the initial magnetic field of the first axis.

For example, if the direction of the initial magnetic field M0 is the same as the positive direction of axis Z, a third 90° pulse is applied to the tight reservoir rock when the oil phase magnetization vector is in the positive direction of axis Z and the water phase magnetization vector is in the positive and negative directions of axis Y, so that the water phase magnetization vector in the positive and negative directions of axis Y is turned to the positive direction of axis Z, and the specific turning direction is related to the application direction of the third 90° pulse. The detailed situations are described as follows.

Figure 13:
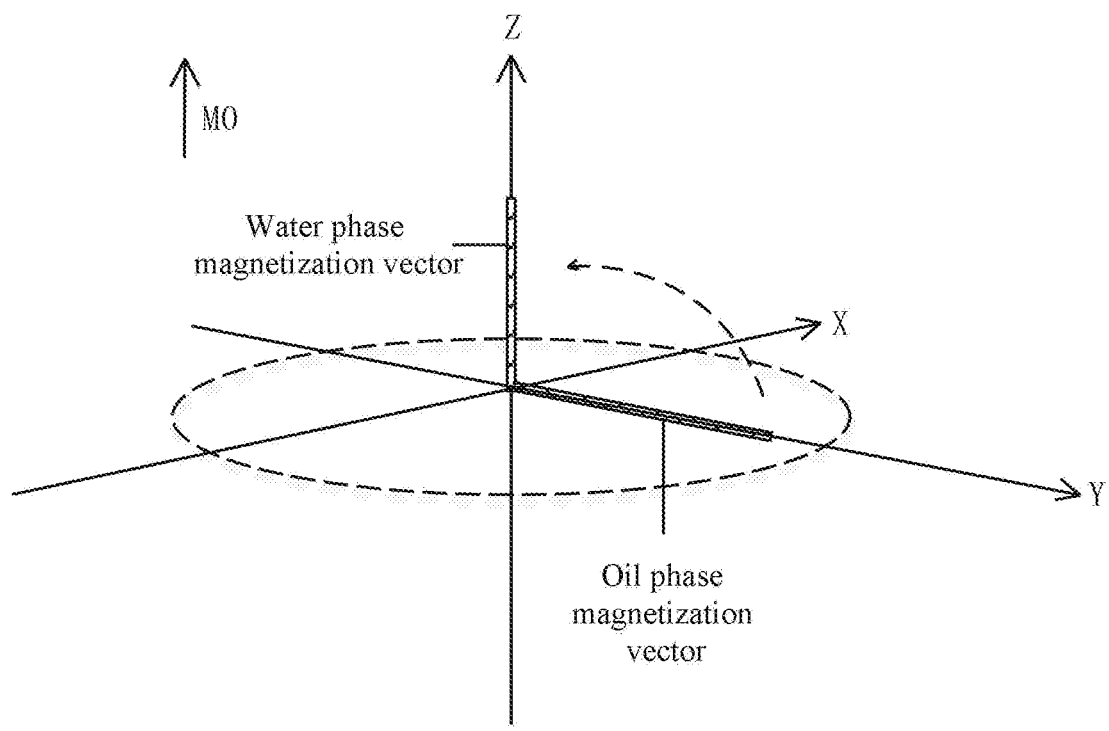
FIG. 13 is a schematic diagram in which a water phase magnetization vector is in a positive direction of axis Z and an oil phase magnetization vector is in a positive direction of axis Y after a third 90° pulse is applied in an embodiment of the present invention.

Situation 1: currently, the water phase magnetization vector is in the negative direction of axis Y, then a third 90° pulse turned from the negative direction of axis Y to the positive direction of axis Z is applied to the tight reservoir rock, i.e., the application direction of the third 90° pulse is the same as that of the first 90° pulse. The water phase magnetization vector is located in the positive direction of axis Z and in an equilibrium state, and the oil phase magnetization vector is located in the positive direction of axis Y, as shown in FIG. 13.

Figure 14:
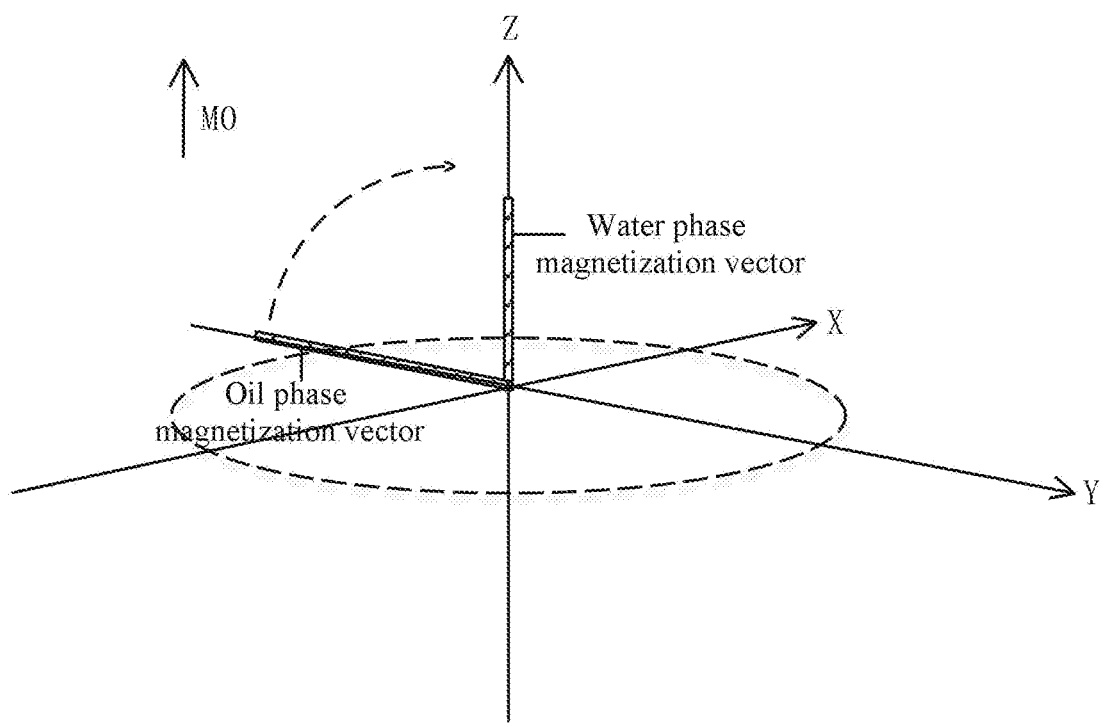
FIG. 14 is a schematic structural diagram in which a water phase magnetization vector is in a positive direction of axis Z and an oil phase magnetization vector is in a negative direction of axis Y after a third 90° pulse is applied in an embodiment of the present invention.

Situation 2: currently, the water phase magnetization vector is in the positive direction of axis Y, then a third 90° pulse turned from the axis Y positive direction to the positive direction of axis Z is applied to the tight reservoir rock, i.e., the application direction of the third 90° pulse is opposite to that of the first 90° pulse. The water phase magnetization vector is located in the positive direction of axis Z and in an equilibrium state, and the oil phase magnetization vector is located in the negative direction of axis Y, as shown in FIG. 14.

Step 103*b*: applying a second gradient magnetic field to the tight reservoir rock for a third time duration, within a preset time period after the third 90° pulse is applied, so as to offset the first gradient magnetic field applied to the tight reservoir rock.

For example, if the direction of the initial magnetic field M0 is the same as the positive direction of axis Z, a second gradient magnetic field with the same intensity and the opposite direction of the first gradient magnetic field is applied to the tight reservoir rock for a third time duration, when the third 90° pulse is applied, the water phase magnetization vector is located in the positive direction of axis Z, and the oil phase magnetization vector is located in the negative-positive-negative directions of axis Y, so as to offset the first gradient magnetic field applied to the tight reservoir rock, thereby causing the oil phase magnetization vector to cut the magnetic induction line and generate an echo signal while being recovered to the equilibrium state in the positive direction of axis Z.

As can be seen from the above description, the method for measuring the oil content of the tight reservoir provided by the embodiments of the present invention adds a diffusion dimension on the basis of the relaxation dimension (the diffusion refers to an irregular thermal motion of molecules, i.e., Brownian motion; and the diffusion in nuclear magnetic resonance generally refers to a phenomenon in which oil/water molecules continuously and randomly change the motion directions and positions; a velocity of molecular diffusion is called as a diffusion coefficient, and the oil/water molecules have different diffusion coefficients; by applying certain conditions, a difference will be produced between the oil and water signals in terms of the diffusion dimension); by using the diffusion relaxation characteristics difference between the oil phase and the water phase in the tight reservoir rock, and by applying a gradient magnetic field, the water phase nuclear magnetic resonance signal is rapidly attenuated to zero by specific pulses and gradients, while the oil phase nuclear magnetic resonance signal is retained; next, specific pulses and gradients are applied to recover the oil phase nuclear magnetic resonance signal; since the influence of the water phase is excluded, the embodiments of the present application can achieve a collection of an oil nuclear magnetic resonance signal with the relaxation time $T_2$ less than 6.7 ms, especially is 0.01 ms to 1 ms, so as to avoid the mutual influence between the short relaxation oil and water signals in the nanopores, and effectively detect the oil phase nuclear magnetic resonance signal in the nanopores, thereby acquiring more accurate oil content of the tight reservoir rock, and avoiding the problem of a high measured value of the oil content due to the influence of the water phase.

In one implementation, step 300 of the method for measuring the oil content of the tight reservoir based on nuclear magnetic resonance in the embodiment of the present invention specifically comprises:

if the nuclear magnetic resonance signal is an echo signal, determining that an oil phase magnetization vector corresponding to an oil phase substance in the current tight reservoir rock is turned from a second axis to a direction of an initial magnetic field, and then determining that the current nuclear magnetic resonance signal is an oil phase nuclear magnetic resonance signal, wherein the second axis is perpendicular to the direction of the initial magnetic field.

Figure 15:
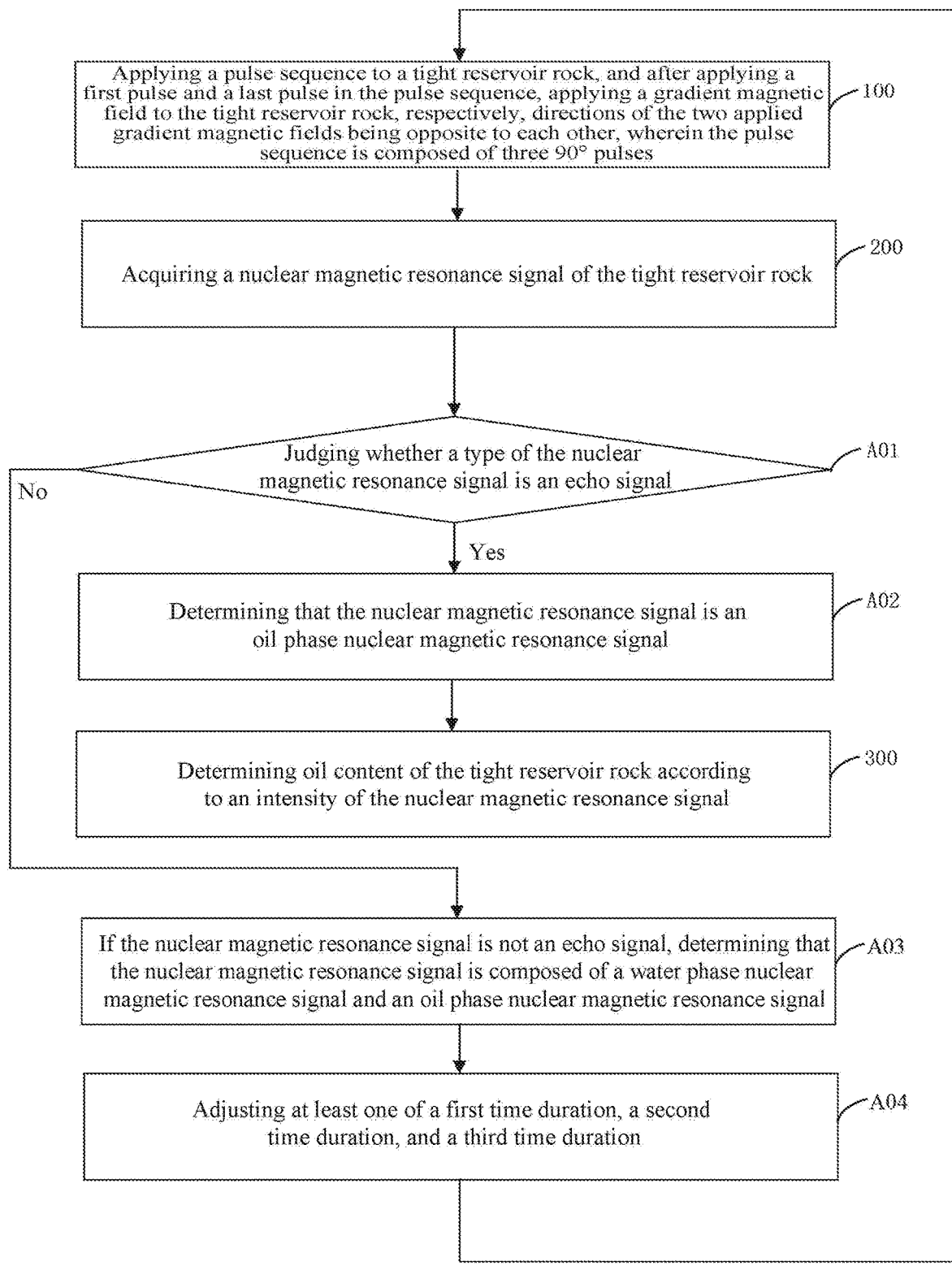
FIG. 15 is a schematic flow chart of a method for measuring oil content of a tight reservoir based on nuclear magnetic resonance including steps A03 and A04 in an embodiment of the present invention.

In one implementation, referring to FIG. 15, after steps A01 and A02, the method for measuring the oil content of the tight reservoir based on nuclear magnetic resonance in the embodiment of the present invention further specifically comprises:

the function of the judging process of steps A01 and A02 is to detect whether the execution of step 100 successfully separates the oil phase magnetization vector from the water phase magnetization vector, while offsetting the gradient magnetic field initially applied. If the type of the nuclear magnetic resonance signal is not an echo signal, it can be determined that no echo signal is generated at present, and the reason may be that the first time duration, the second time duration, and the third time duration are not set accurately enough. Thus, it is necessary to adjust the three time values, and select to adjust one or more of them according to the actual measurement situation, specifically comprising:

step A03: if the nuclear magnetic resonance signal is not an echo signal, determining that the nuclear magnetic resonance signal is composed of a water phase nuclear magnetic resonance signal and an oil phase nuclear magnetic resonance signal;

step A04: adjusting at least one of a first time duration, a second time duration, and a third time duration;

wherein, the first time duration is a persistent period of an application of a first gradient magnetic field to the tight reservoir rock, the second time duration is a time interval between a second 90° pulse and a third 90° pulse in the pulse sequence, and the third time duration is a persistent period of an application of a second gradient magnetic field to the tight reservoir rock, the first and second gradient magnetic fields having opposite directions;

and re-executing the pulse sequence and magnetic field application step based on at least one of the first time duration, the second time duration, and the third time duration having been adjusted.

As can be seen from the above description, the method for measuring the oil content of the tight reservoir provided by the embodiment of the present invention can further improve the reliability and accuracy of the measurement of the oil content of the tight reservoir.

Figure 16:
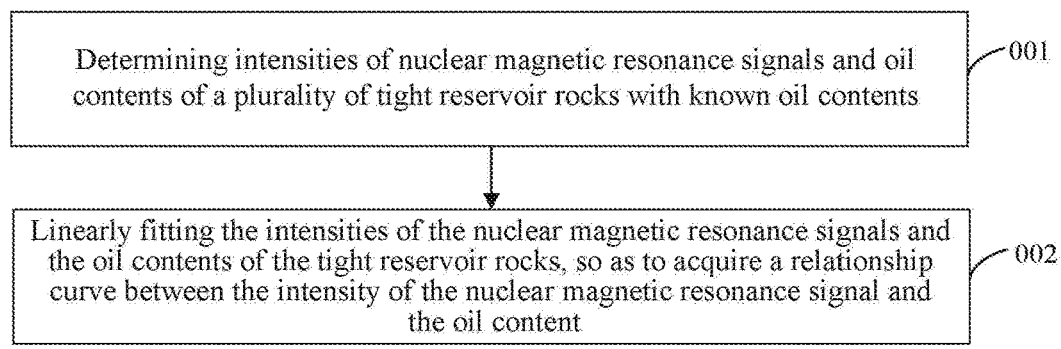
FIG. 16 is a schematic flow chart of steps 001 and 002 of a method for measuring oil content of a tight reservoir based on nuclear magnetic resonance in an application example of the present invention.

In one implementation, referring to FIG. 16, a relationship curve in the method for measuring the oil content of the tight reservoir based on nuclear magnetic resonance in the embodiment of the present invention is pre-acquired in the following steps:

step 001: determining intensities of nuclear magnetic resonance signals and oil contents of a plurality of tight reservoir rocks with known oil contents;

step 002: linearly fitting the intensities of the nuclear magnetic resonance signals and the oil contents of the tight reservoir rocks, so as to acquire a relationship curve between the intensity of the nuclear magnetic resonance signal and the oil content.

It can be understood that the relationship curve includes: $y=ax+b$.

Wherein, y represents an intensity of the nuclear magnetic resonance signal; x represents an oil content; and a and b are constants.

Since the intensity of the oil phase nuclear magnetic resonance signal is linearly related to the oil content, the relationship curve $y=ax+b$ between the intensity of the oil phase nuclear magnetic resonance signal and the oil content can be pre-acquired by linear fitting, wherein y represents an intensity of the nuclear magnetic resonance signal; x represents an oil content; and a and b are constants. Specifically, the intensities of the nuclear magnetic resonance signals and the oil contents of the plurality of tight reservoir rocks are determined at first; next, the intensities of the nuclear magnetic resonance signals and the oil contents of the tight reservoir rocks are linearly fitted with each other, so as to acquire a relationship curve between the intensity of the nuclear magnetic resonance signal and the oil content.

Thus, after an intensity of a nuclear magnetic resonance signal is acquired, it may be substituted into the relationship curve to acquire an oil content of a tight reservoir rock to be detected. Of course, in other embodiments of the present application, the oil percentage may also be calculated, or both the oil content and the oil percentage may be calculated.

Figure 17:
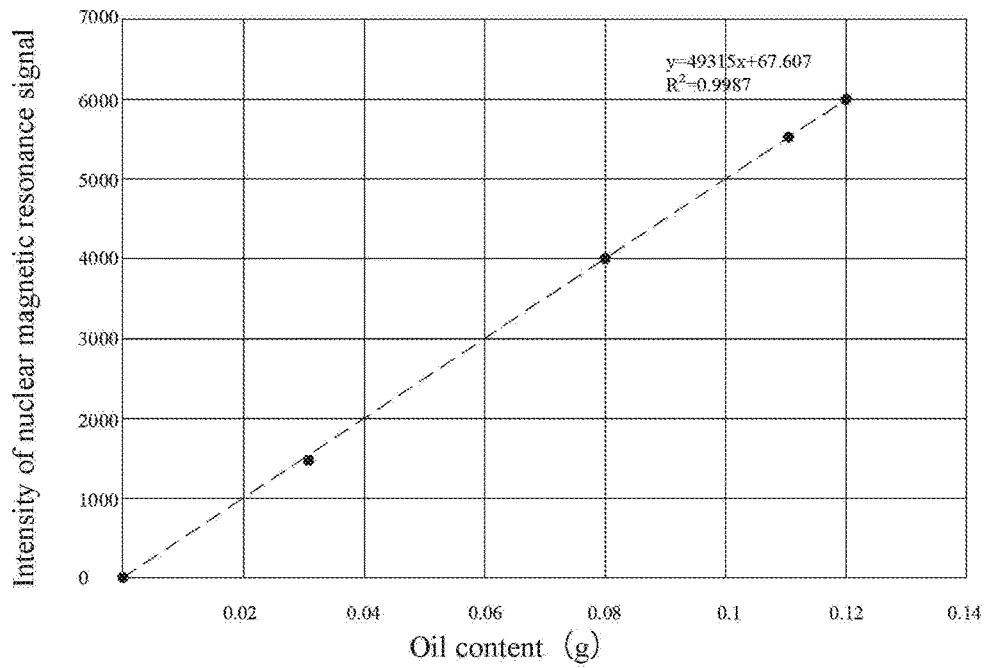
FIG. 17 is a schematic curve graph of relationship between an oil phase nuclear magnetic resonance signal and oil content in an application example of the present invention.

For example, the used static magnetic field has an intensity of 0.2 T, the gradient magnetic field may use a gradient coil with a gradient of 0.6 T/m, the 90° pulse has a width of 6 us, τ=0.9 ms, and T=7 ms. As shown in FIG. 17, in this exemplary embodiment, the relationship curve between the oil phase nuclear magnetic resonance signal and the oil content can be pre-acquired by fitting five artificial simulated samples with known oil contents through an equation:

$$y=49315*x+67.607 \qquad \text{Equation 2}$$

wherein, y represents an intensity of the nuclear magnetic resonance signal; x represents an oil content; 49315 is a slope; and 67.607 is an intercept. R is a correlation coefficient, which represents a degree of linear correlation between two sets of data, and the correlation is higher when R approaches 1. $R^2$ is a square of the correlation coefficient and has a function similar to that of the correlation coefficient.

Thus, by substituting the acquired oil phase nuclear magnetic resonance signal of each rock sample into the relationship curve $y=49315*x+67.607$, the oil content of each rock sample can be obtained correspondingly, as shown in the following Table 1:

TABLE 1

| Sample No. | Mass (g) | Intensity of oil phase nuclear magnetic resonance signal | Oil percentage | Oil content (g) |
| --- | --- | --- | --- | --- |
| 1 | 12.63 | 1355 | 0.21% | 0.0261 |
| 2 | 9.24 | 1140 | 0.24% | 0.0217 |
| 3 | 6.02 | 774 | 0.24% | 0.0143 |
| 4 | 6.49 | 548 | 0.15% | 0.0097 |
| 5 | 6.68 | 837 | 0.23% | 0.0156 |
| 6 | 4.633 | 779 | 0.31% | 0.0144 |
| 7 | 19.193 | 1368 | 0.14% | 0.0264 |
| 8 | 0.7736 | 2149 | 5.46% | 0.0422 |

When the tight reservoir rock contains different hydrogen, its amplitude M(t) can be expressed as:

$$M(t) = \sum_i P_i \exp\left(-\frac{t}{T_{2i}}\right) \qquad \text{Equation 3}$$

For example, when there are hydrogen protons in both the oil phase and the water phase in the tight reservoir rock, the amplitude M(t) can be expressed as:

$$M(t) = P_{oil} \exp\left(-\frac{t}{T_{2oil}}\right) + P_{water}\exp\left(-\frac{t}{T_{2water}}\right) \qquad \text{Equation 4}$$

wherein, $P_i$ represents an amplitude of the nuclear magnetic resonance signal of each hydrogen component in the rock, and can be classified into oil and water phases, i.e., $P_{oil}$ and $P_{water}$; t represents relaxation time in a unit of ms; and $T_{2oil}$ and $T_{2water}$ represent transverse relaxation time of oil and water nuclear magnetic resonances, respectively, and they are constant values under particular conditions.

Figure 18:
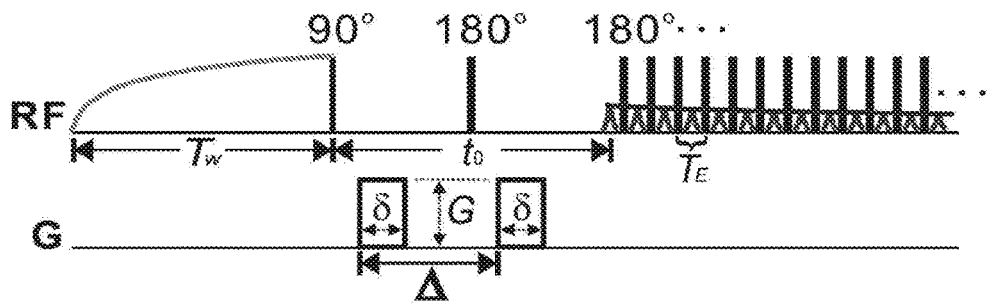
FIG. 18 is a schematic diagram of a control logic for measuring oil content of a tight reservoir by applying a PFG pulse sequence in an application example of the present invention.

In one way, the PFG pulse sequence may be used to measure the oil content of the tight reservoir, with its control logic as shown in FIG. 18, and an echo amplitude of the applied PFG pulse sequence is expressed in the following equation:

$$b_{ik} = \sum_{j=1}^{m}\sum_{p=1}^{n} f(D_p, T_{2j})\exp\left[-\gamma^2 G_k^2 \delta^2 \left(\Delta - \frac{\delta}{3}\right)D_p\right] \times \exp\left[-\frac{(i-1)\cdot T_E + t_0}{T_{2j}}\right] \quad i = 1, 2, 3, \ldots \quad \text{Equation 5}$$

wherein, $b_{ik}$ is a diffusion weight; m is the number of distribution points of the transverse relaxation time T2; n is the number of distribution points of a diffusion coefficient D; j is a serial number of the transverse relaxation time T2; p is a serial number of the diffusion coefficient D; f( ) is an amplitude; $D_p$ is a diffusion coefficient; $T_{2j}$ is a transverse relaxation time; γ is a gyromagnetic ratio; $G_k$ is a diffusion gradient magnetic field intensity; δ is a diffusion gradient pulse time duration;

$$\left(\Delta - \frac{\delta}{3}\right)$$

is a diffusion time; i is a serial number of an echo peak point; $T_E$ is a time during which the water phase nuclear magnetic resonance signal can be shielded.

As can be seen from equation 5, it needs sufficient gradient magnitude and application time to distinguish the oil and water signals. When $D_p = 2.5e^{-9}$, $G_k = 50$ guass/cm, and $T_E = 13.5$ ms at that time (the real signal is: 0.00864, δ=4.5 ms). Theoretically, this sequence requires $T_E = 13.5$ ms to completely shield the water phase nuclear magnetic resonance signal. However, $T_E$ is too large, and it is impossible to quickly obtain the oil phase nuclear magnetic resonance signal with short relaxation time (i.e., small pores).

Figure 19:
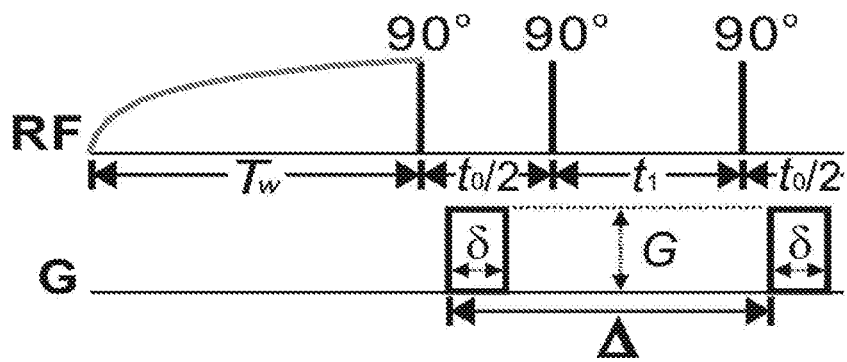
FIG. 19 is a schematic diagram of a control logic for executing a pulse sequence and magnetic field application step by applying a pulse sequence in an application example of the present invention.

In an application example of the present application, the pulse sequence and the magnetic field application step is executed by using the pulse sequence. The control logic of the pulse sequence and the magnetic field application step is shown in FIG. 19, and the echo amplitude of the application of the pulse sequence in the present invention is expressed as follows:

$$b_{ik} = \sum_{j=1}^{m}\sum_{p=1}^{n}\sum_{q=1}^{s} f(T_{1q}, D_p, T_{2j})\exp\left[-\gamma^2 G_k^2 \delta^2 \left(\Delta - \frac{\delta}{3}\right)D_p\right] \times \exp\left(-\frac{t_1}{T_{1q}}\right)\exp\left[-\frac{(i-1)\cdot T_E + t_0}{T_{2j}}\right] \quad i = 1, 2, 3, \ldots \quad \text{Equation 6}$$

wherein, $b_{ik}$ is a diffusion weight; m is the number of distribution points of transverse relaxation time T2; n is the number of distribution points of a diffusion coefficient D; j is a serial number of the transverse relaxation time T2; p is a serial number of the diffusion coefficient D; s is the number of distribution points of longitudinal relaxation time T1; q is a serial number of the longitudinal relaxation time T1; f( ) is an amplitude; $T_{1q}$ is longitudinal relaxation time; $D_p$ is a diffusion coefficient; $T_{2j}$ is transverse relaxation time; γ is a gyromagnetic ratio; $G_k$ is a diffusion gradient magnetic field intensity; δ is a diffusion gradient pulse time duration;

$$\left(\Delta - \frac{\delta}{3}\right)$$

is diffusion time; i is a serial number of an echo peak point; $T_E$ is a time during which the water phase nuclear magnetic resonance signal can be shielded; $t_1$ is a longitudinal relaxation time window length; and $t_0$ is a transverse relaxation time window length.

As can be seen from equation 6, by decreasing $t_0$ and increasing $t_1$, the sampling start time is shortened as much as possible, and the short relaxation signal is retained. The large magnetic field gradient and application time ($t_1$) suppress the water signal, thereby enabling $T_E$ to be as short as 0.3 ms.

Figure 20:
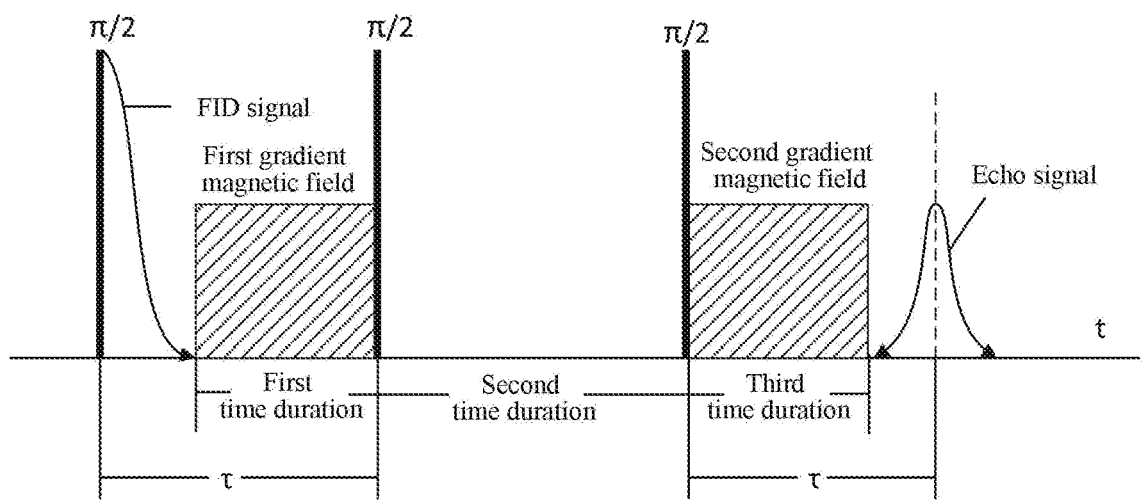
FIG. 20 is a schematic diagram of a pulse sequence in an application example of the present invention.

It is clear that in the method for measuring the oil content of the tight reservoir based on nuclear magnetic resonance in the embodiments of the present invention, the structure of the pulse sequence is one 90° pulse followed by two 90° pulses, as shown in FIG. 20. A free induction attenuation signal appears after the first 90° pulse, and an echo signal appears after the third 90° pulse. In general, the nuclear magnetic resonance signals of the tight reservoir rock only come from water and oil, and at that time, the FID signal is a sum of the signals of water and oil. As explained above, there is a difference at an order of magnitude between the diffusion coefficients of water and oil in the tight reservoir rock. Thus, after the diffusion of time T, a peak value of the first echo appearing after the third 90° pulse is the oil phase nuclear magnetic resonance signal.

Figure 21:
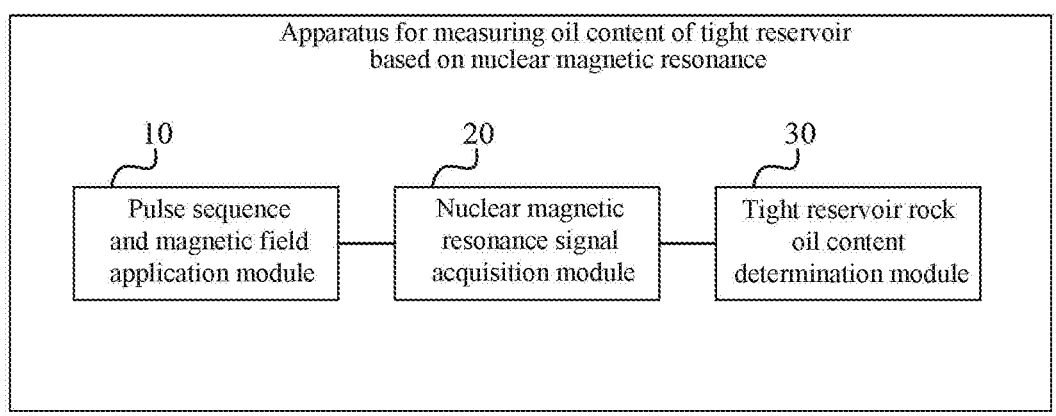
FIG. 21 is a schematic structural diagram of an apparatus for measuring oil content of a tight reservoir based on nuclear magnetic resonance in an embodiment of the present invention.

From a perspective of software, the embodiments of the present invention further provide an implementation of an apparatus for measuring oil content of a tight reservoir based on nuclear magnetic resonance, which is capable of implementing the method for measuring oil content of the tight reservoir based on nuclear magnetic resonance. Referring to FIG. 21, the apparatus for measuring oil content of the tight reservoir based on nuclear magnetic resonance specifically comprises:

a pulse sequence and magnetic field application module 10 configured to execute a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

a nuclear magnetic resonance signal acquisition module 20 configured to acquire a nuclear magnetic resonance signal of the tight reservoir rock;

a tight reservoir rock oil content determination module 30 configured to determine oil content of the tight reservoir rock according to an intensity of the nuclear magnetic resonance signal.

The apparatus for measuring oil content of a tight reservoir based on nuclear magnetic resonance provided by the embodiments of the present application specifically can execute the processing flows of the method for measuring oil content of a tight reservoir based on nuclear magnetic resonance in the above embodiments, and its functions are omitted herein, please refer to the above method embodiments for details.

As can be seen from the above description, the apparatus for measuring oil content of a tight reservoir based on nuclear magnetic resonance provided by the embodiments of the present application firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, determines whether the applied gradient magnetic field is offset by detecting the nuclear magnetic resonance signal of the tight reservoir rock and judging whether the type of the nuclear magnetic resonance signal is an echo signal, so as to improve the accuracy and reliability of acquisition of the oil phase nuclear magnetic resonance signal; and finally, if the nuclear magnetic resonance signal is an echo signal, determines that the nuclear magnetic resonance signal is only the oil phase nuclear magnetic resonance signal, and determines the oil content of the tight reservoir rock according to the intensity of the oil phase nuclear magnetic resonance signal, thereby effectively improving the accuracy of the detection result of the oil content of the tight reservoir rock.

In one implementation, the apparatus for measuring the oil content of the tight reservoir further comprises:

a signal type judgment unit A1 configured to judge whether a type of the nuclear magnetic resonance signal is an echo signal;

an oil phase nuclear magnetic resonance signal determination unit A2 configured to determine that the nuclear magnetic resonance signal is an oil phase nuclear magnetic resonance signal, if the type of the nuclear magnetic resonance signal is an echo signal.

In one implementation, the pulse sequence and magnetic field application module 10 comprises:

a first 90° pulse application unit 11 configured to apply a first 90° pulse to the tight reservoir rock, and apply a first gradient magnetic field to the tight reservoir rock within a preset time period after the first 90° pulse is applied;

a second 90° pulse application unit 12 configured to apply a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field.

a third 90° pulse application unit 13 configured to apply a third 90° pulse when the oil phase magnetization vector is in the direction of the initial magnetic field and the water phase magnetization vector is turned from an opposite direction of the initial magnetic field of the first axis to the second axis, and apply a second gradient magnetic field to the tight reservoir rock within a preset time period after the third 90° pulse is applied, wherein the first and second gradient magnetic fields have a same intensity and opposite directions.

In which, the first 90° pulse application unit 11 comprises:

a first pulse application subunit 11a configured to apply a first 90° pulse to the tight reservoir rock, so that the oil phase magnetization vector and the water phase magnetization vector are both turned from the opposite direction of the initial magnetic field of the first axis to a same direction of the second axis;

a first gradient magnetic field application subunit 11b configured to apply a first gradient magnetic field to the tight reservoir rock for a first time duration, within a preset time period after the first 90° pulse is applied, so that the oil phase magnetization vector and the water phase magnetization vector are rotated to positive and negative directions of the second axis, respectively.

In which, the second 90° pulse application unit 12 comprises:

a second pulse application subunit 12a configured to apply a second 90° pulse to the tight reservoir rock and waiting for a second time duration, turn the oil phase magnetization vector and the water phase magnetization vector from the second axis to the direction of the initial magnetic field of the first axis and the opposite direction thereof, respectively, and then turn the water phase magnetization vector from the opposite direction of the initial magnetic field of the first axis to the second axis.

In which, the third 90° pulse application unit 13 comprises:

a third pulse application subunit 13a configured to apply a third 90° pulse, so that the oil phase magnetization vector is turned from the direction of the initial magnetic field of the first axis to the second axis, and the water phase magnetization vector is turned from the second axis to the direction of the initial magnetic field of the first axis;

a second gradient magnetic field application subunit 13b configured to apply a second gradient magnetic field to the tight reservoir rock for a third time duration, within a preset time period after the third 90° pulse is applied, so as to offset the first gradient magnetic field applied to the tight reservoir rock.

In one implementation, the tight reservoir rock oil content determination module 30 comprises:

an oil phase nuclear magnetic resonance signal determination unit 31 configured to, if the nuclear magnetic resonance signal is an echo signal, determine that the oil phase magnetization vector corresponding to the oil phase substance in the current tight reservoir rock is turned from the second axis to the direction of the initial magnetic field, and then determine that the current nuclear magnetic resonance signal is an oil phase nuclear magnetic resonance signal;

wherein the second axis is perpendicular to the direction of the initial magnetic field.

In one implementation, the apparatus for measuring the oil content of the tight reservoir further comprises:

an oil and water mixed signal determination unit 40 configured to, if the nuclear magnetic resonance signal is not an echo signal, determine that the nuclear magnetic resonance signal is composed of a water phase nuclear magnetic resonance signal and an oil phase nuclear magnetic resonance signal;

a time adjustment unit 50 configured to adjust at least one of a first time duration, a second time duration, and a third time duration;

wherein, the first time duration is a persistent period of the application of the first gradient magnetic field to the tight reservoir rock, the second time duration is a time interval between the second 90° pulse and the third 90° pulse in the pulse sequence, and the third time duration is a persistent period of the application of the second gradient magnetic field to the tight reservoir rock, the first and second gradient magnetic fields having opposite directions;

a repeated application unit 60 configured to re-execute the pulse sequence and magnetic field application step based on at least one of the first time duration, the second time duration, and the third time duration having been adjusted.

In one implementation, the tight reservoir rock oil content determination module 30 further comprises:

a tight reservoir rock oil content acquiring unit 32 configured to acquire oil content of the tight reservoir rock according to a relationship curve between the intensity of the oil phase nuclear magnetic resonance signal, a preset intensity of the nuclear magnetic resonance signal and the oil content.

The apparatus for measuring oil content of a tight reservoir based on nuclear magnetic resonance further comprises: a relationship curve pre-acquisition module 00 configured to pre-acquire the relationship curve;

the relationship curve pre-acquisition module 00 comprises:

a known data acquisition unit 01 configured to determine intensities of nuclear magnetic resonance signals and oil contents of a plurality of tight reservoir rocks with known oil contents;

a liner fitting unit 02 configured to linearly fit the intensities of the nuclear magnetic resonance signals and the oil contents of the tight reservoir rocks, so as to acquire a relationship curve between the intensity of the nuclear magnetic resonance signal and the oil content.

As can be seen from the above description, the apparatus for measuring the oil content of the tight reservoir provided by the embodiments of the present invention adds a diffusion dimension on the basis of the relaxation dimension (the diffusion refers to an irregular thermal motion of molecules, i.e., Brownian motion; and the diffusion in nuclear magnetic resonance generally refers to a phenomenon in which oil/water molecules continuously and randomly change the motion directions and positions; a velocity of molecular diffusion is called as a diffusion coefficient, and the oil/water molecules have different diffusion coefficients; by applying certain conditions, a difference will be produced between the oil and water signals in terms of the diffusion dimension); by using the diffusion relaxation characteristics difference between the oil phase and the water phase in the tight reservoir rock, and by applying a gradient magnetic field, the water phase nuclear magnetic resonance signal is rapidly attenuated to zero by specific pulses and gradients, while the oil phase nuclear magnetic resonance signal is retained; next, specific pulses and gradients are applied to recover the oil phase nuclear magnetic resonance signal; since the influence of the water phase is excluded, the embodiments of the present application can achieve a collection of an oil nuclear magnetic resonance signal with the relaxation time $T_2$ less than 6.7 ms, especially is 0.01 ms to 1 ms, so as to avoid the mutual influence between the short relaxation oil and water signals in the nanopores, and effectively detect the oil phase nuclear magnetic resonance signal in the nanopores, thereby acquiring more accurate oil content of the tight reservoir rock, and avoiding the problem of a high measured value of the oil content due to the influence of the water phase.

Figure 22:
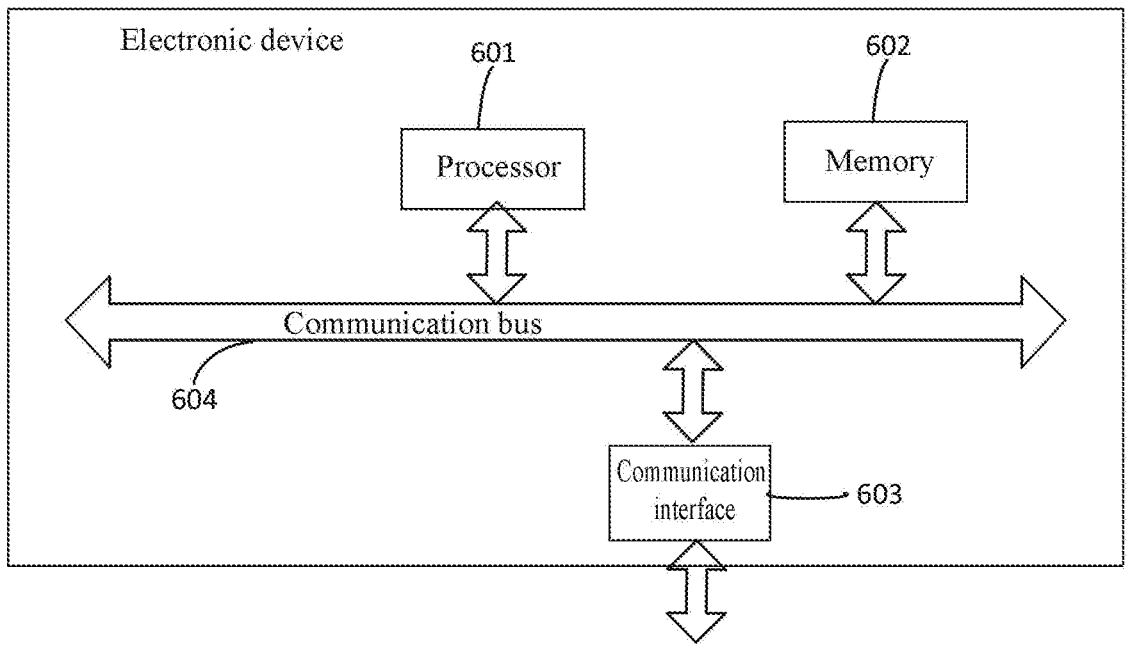
FIG. 22 is a schematic structural diagram of an electronic device in an embodiment of the present invention.

The embodiments of the present application further provide an implementation of an electronic device capable of implementing all the steps in the method for measuring the oil content of the tight reservoir based on nuclear magnetic resonance in the above embodiments. Referring to FIG. 22, the electronic device specifically comprises:

a processor 601, a memory 602, a communication interface 603, and a bus 604;

wherein, the processor 601, the memory 602 and the communication interface 603 complete communications with each other through the bus 604; the communication interface 603 is configured to achieve information transmission between the apparatus for measuring oil content of a tight reservoir based on nuclear magnetic resonance and related device such as a user terminal;

the processor 601 is configured to invoke a computer program in the memory 602; when executing the computer program, the processor realizes all steps in the method for measuring the oil content of the tight reservoir based on nuclear magnetic resonance in the above embodiments; for example, when executing the computer program, the processor realizes the following steps:

step 100: a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

Step 200: acquiring a nuclear magnetic resonance signal of the tight reservoir rock.

If the nuclear magnetic resonance signal is an echo signal.

Step 300: determining oil content of the tight reservoir rock according to an intensity of the nuclear magnetic resonance signal.

As can be seen from the above description, the electronic device provided by the embodiments of the present invention firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, determines whether the applied gradient magnetic field is offset by detecting the nuclear magnetic resonance signal of the tight reservoir rock and judging whether the type of the nuclear magnetic resonance signal is an echo signal, so as to improve the accuracy and reliability of acquisition of the oil phase nuclear magnetic resonance signal; and finally, if the nuclear magnetic resonance signal is an echo signal, determines that the nuclear magnetic resonance signal is only the oil phase nuclear magnetic resonance signal, and determines the oil content of the tight reservoir rock according to the intensity of the oil phase nuclear magnetic resonance signal, thereby effectively improving the accuracy of the detection result of the oil content of the tight reservoir rock.

The embodiments of the present invention further provide a computer readable storage medium capable of realizing all steps in the method for measuring the oil content of the tight reservoir based on nuclear magnetic resonance in the above embodiments. The computer readable storage medium stores a computer program, which when being executed by a processor, executes all steps in the method for measuring the oil content of the tight reservoir based on nuclear magnetic resonance in the above embodiments. For example, when being executed by a processor, the computer program realizes the following steps:

step 100: a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses;

step 200: acquiring a nuclear magnetic resonance signal of the tight reservoir rock;

step 300: determining oil content of the tight reservoir rock according to an intensity of the nuclear magnetic resonance signal.

As can be seen from the above description, the computer readable storage medium provided by the embodiments of the present invention firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, determines whether the applied gradient magnetic field is offset by detecting the nuclear magnetic resonance signal of the tight reservoir rock and judging whether the type of the nuclear magnetic resonance signal is an echo signal, so as to improve the accuracy and reliability of acquisition of the oil phase nuclear magnetic resonance signal; and finally, if the nuclear magnetic resonance signal is an echo signal, determines that the nuclear magnetic resonance signal is only the oil phase nuclear magnetic resonance signal, and determines the oil content of the tight reservoir rock according to the intensity of the oil phase nuclear magnetic resonance signal, thereby effectively improving the accuracy of the detection result of the oil content of the tight reservoir rock.

Figure 23:
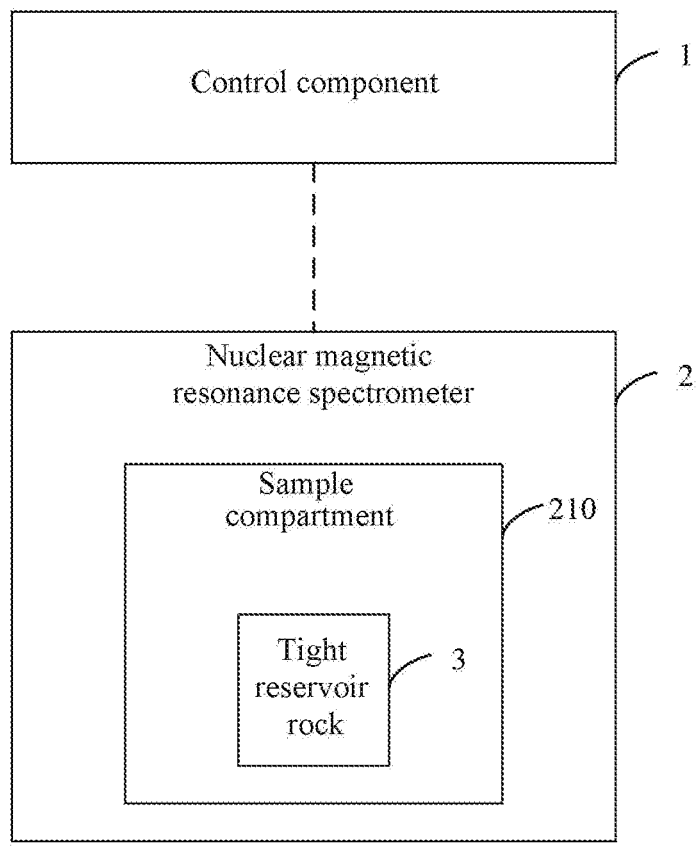
FIG. 23 is a schematic structural diagram of a system for measuring oil content of a tight reservoir based on nuclear magnetic resonance in an embodiment of the present invention.

From a perspective of a physical device, the embodiments of the present invention further provide an implementation of a system for measuring oil content of a tight reservoir based on nuclear magnetic resonance, which is capable of realizing all steps in the method for measuring the oil content of the tight reservoir based on nuclear magnetic resonance in the above embodiments. Referring to FIG. 23, the system for measuring oil content of the tight reservoir based on nuclear magnetic resonance specifically comprises:

a control component 1 and a nuclear magnetic resonance spectrometer 2 communicatively connected to the control component 1.

The nuclear magnetic resonance spectrometer 2 is provided therein with a sample compartment 210 that contains a tight reservoir rock 3.

The control component 1 is configured to send a control signal to the nuclear magnetic resonance spectrometer 2.

The nuclear magnetic resonance spectrometer 2 executes a pulse sequence and a magnetic field application step on the tight reservoir rock 3 according to the control signal: applying a pulse sequence to a tight reservoir rock, and after applying a first pulse and a last pulse in the pulse sequence, applying a gradient magnetic field to the tight reservoir rock, respectively, directions of the two applied gradient magnetic fields being opposite to each other, wherein the pulse sequence is composed of three 90° pulses; acquiring a nuclear magnetic resonance signal of the tight reservoir rock; sending the nuclear magnetic resonance signal to the control component 1.

The control component 1 is further configured to determine oil content of the tight reservoir rock according to an intensity of the nuclear magnetic resonance signal, and judge whether a type of the nuclear magnetic resonance signal is an echo signal; if yes, determine that the nuclear magnetic resonance signal is an oil phase nuclear magnetic resonance signal, and determine the oil content of the tight reservoir rock 3 according to the intensity of the oil phase nuclear magnetic resonance signal.

Figure 24:
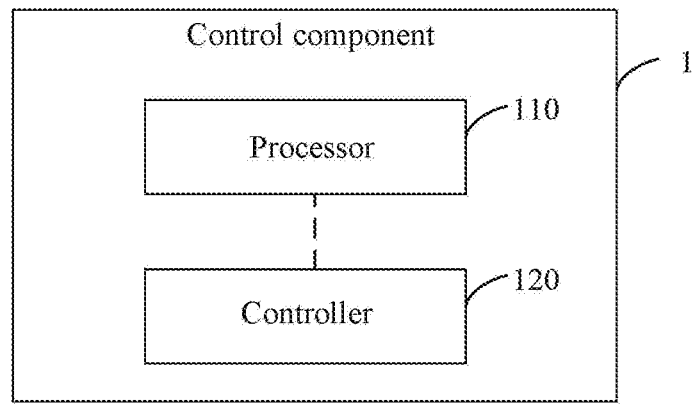
FIG. 24 is a schematic structural diagram of a control component in a system for measuring oil content of a tight reservoir in an embodiment of the present invention.

Referring to FIG. 24, the control component 1 comprises a processor 110 and a controller 120 which are communicatively connected to each other; the processor 110 sends a control signal to the nuclear magnetic resonance spectrometer 2 via the controller 120, receives a nuclear magnetic resonance signal sent by the nuclear magnetic resonance spectrometer 2, and judges whether a type of the nuclear magnetic resonance signal is an echo signal; if yes, determines that the nuclear magnetic resonance signal is an oil phase nuclear magnetic resonance signal, and determines the oil content of the tight reservoir rock 3 according to the intensity of the oil phase nuclear magnetic resonance signal.

Figure 25:
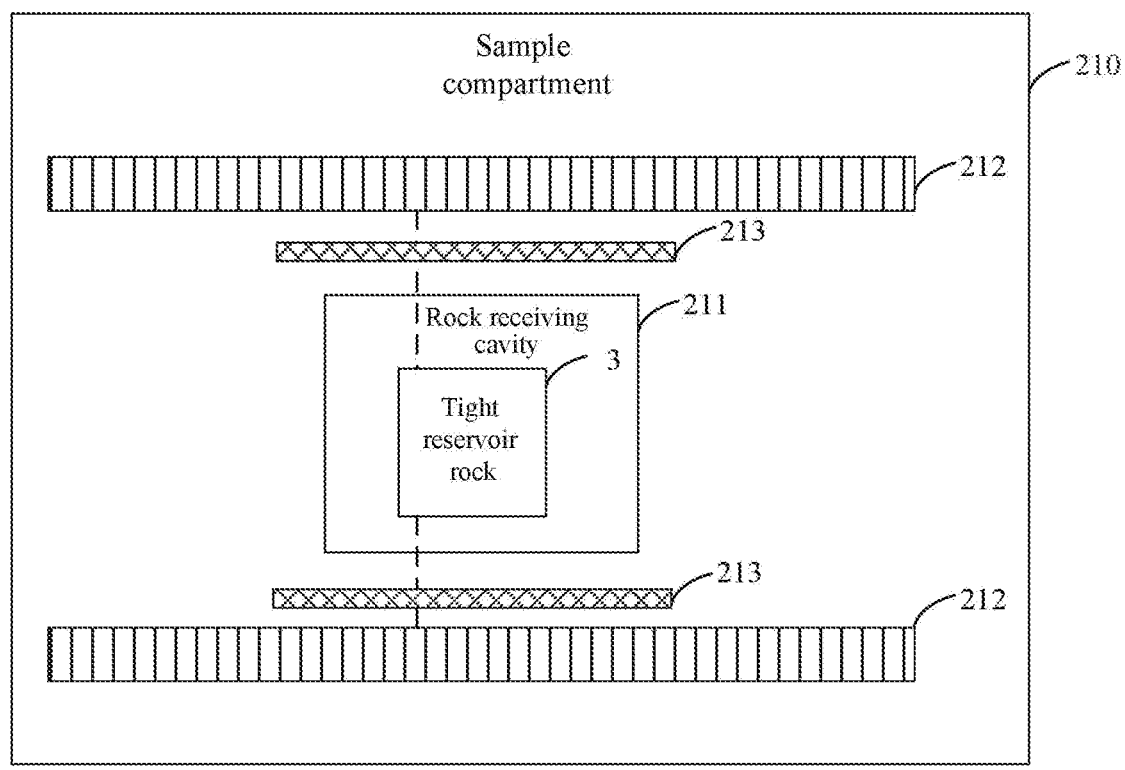
FIG. 25 is a schematic structural diagram of a sample compartment in a system for measuring oil content of a tight reservoir in an embodiment of the present invention.

Referring to FIG. 25, the sample compartment 210 comprises a rock receiving cavity 211 configured to contain the tight reservoir rock, and an electromagnetic coil 212 disposed outside the rock receiving cavity 211.

The electromagnetic coil 212 is configured to apply the pulse sequence to the tight reservoir rock 3 in the rock receiving cavity 211, and acquire a nuclear magnetic resonance signal of the tight reservoir rock 3. In addition, an insulation layer 213 may be further disposed between the electromagnetic coil 212 and the rock receiving cavity 211.

In addition, the sample compartment 210 also comprises a temperature control component 213 in communication with the rock receiving cavity 211 and configured to change a temperature in the rock receiving cavity 211.

Since the diffusion coefficient of a substance is related to the ambient temperature, in order to increase a diffusion speed difference between an oil phase substance and a water phase substance, this embodiment further comprises a step for controlling the temperature of the tight reservoir rock 3. Correspondingly, the system for measuring the oil content of the tight reservoir based on nuclear magnetic resonance should further comprise a temperature control component 213.

Figure 26:
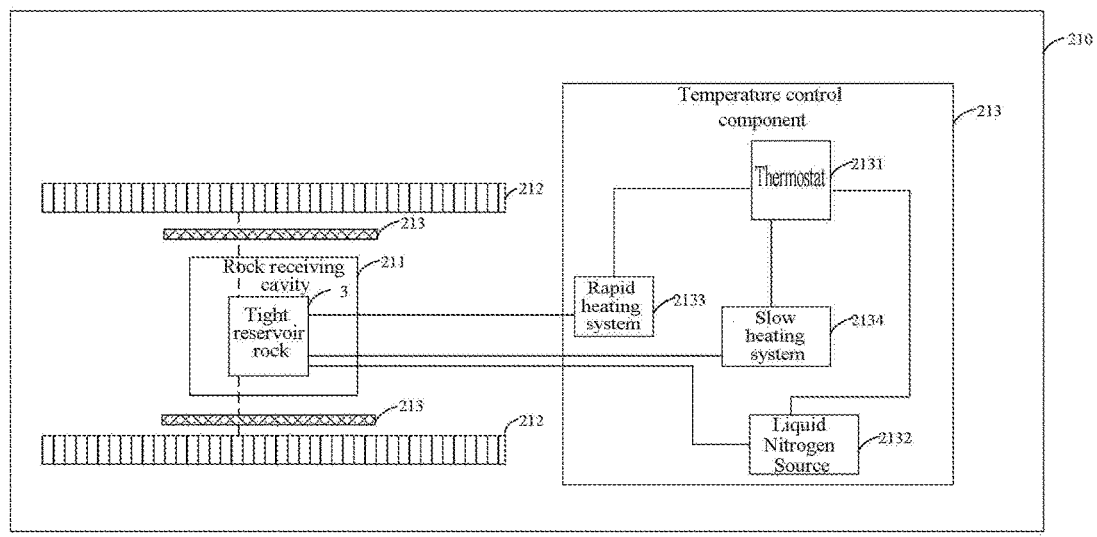
FIG. 26 is a schematic structural diagram of a sample compartment comprising a temperature control component in an embodiment of the present invention.

In one specific example, referring to FIG. 26, the temperature control component 213 comprises a thermostat 2131, a liquid nitrogen source 2132 for cooling or providing a low temperature environment, a rapid heating system 2133 for rapid heating, and a slow heating system 2134 for slow heating. The thermostat 2131 is communicatively connected to the liquid nitrogen source 2132, the rapid heating system 2133, and the slow heating system 2134, respectively, and the liquid nitrogen source 2132, the rapid heating system 2133 and the slow heating system 2134 are all connected to the rock receiving cavity 211, so that the thermostat 2131 controls the liquid nitrogen source 2132 to cool the rock receiving cavity 211, and controls the rapid heating system 2133 and the slow heating system 2134 to heat the rock receiving cavity 211.

Figure 27:
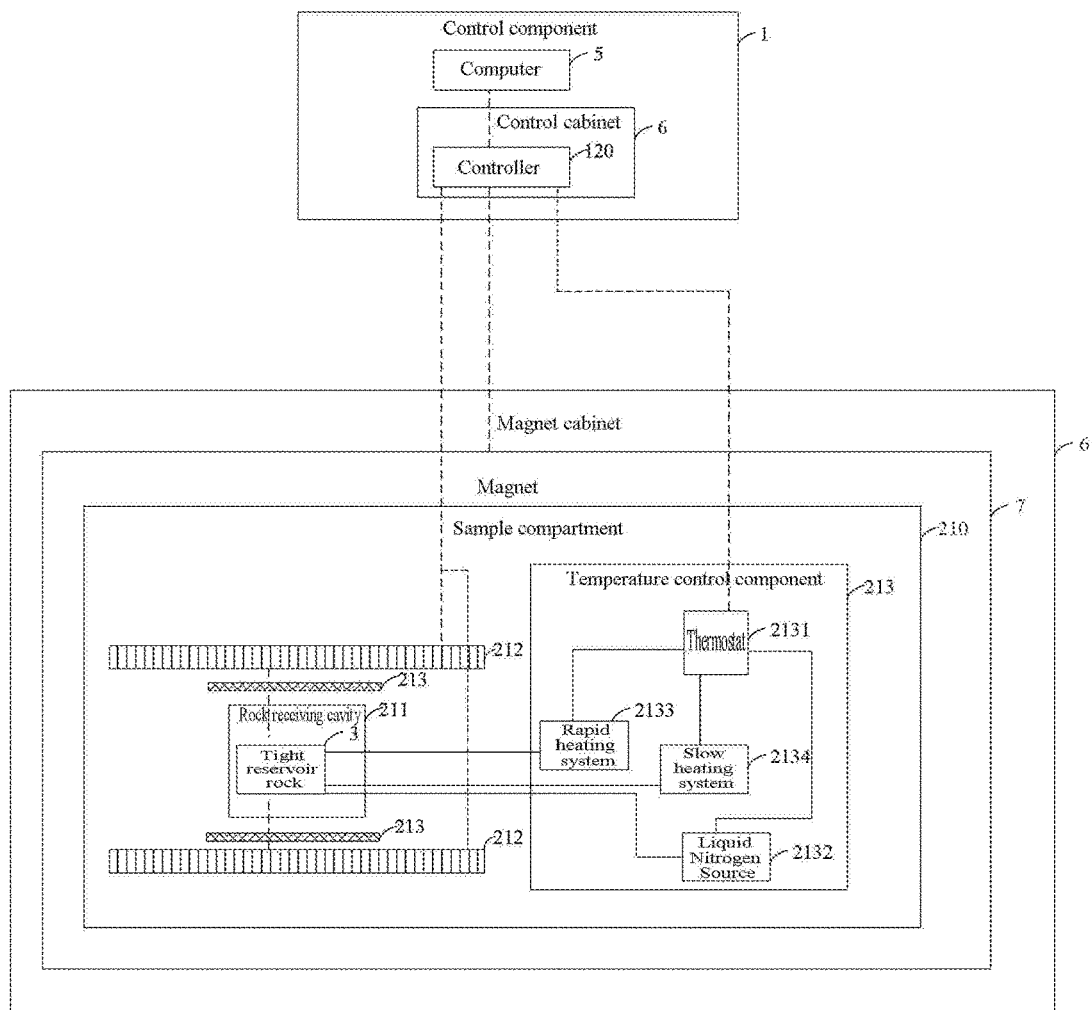
FIG. 27 is a schematic overall structural diagram of a system for measuring oil content of a tight reservoir based on nuclear magnetic resonance in an embodiment of the present invention.

Referring to FIG. 27, the nuclear magnetic resonance spectrometer comprises a magnet 7 configured to apply a gradient magnetic field to the tight reservoir rock, and the magnet 7 may be disposed in a magnet cabinet 4. The processor 110 may be a computer 5, and the controller may be installed in a control cabinet 6.

In one example, the length, width and height of the magnet cabinet 4 may be 826 mm×1120 mm×1326 mm; and the length, width and height of the control cabinet 6 may be 1600 mm×600 mm×1170 mm.

As can be seen from the above description, the system for measuring oil content of a tight reservoir based on nuclear magnetic resonance provided by the embodiments of the present invention firstly distinguishes the oil phase nuclear magnetic resonance signal and the water phase nuclear magnetic resonance signal in the nanopores of the tight reservoir rock from each other, by executing the pulse sequence and magnetic field application step, which concerns three 90° pulses and two gradient magnetic fields, on the tight reservoir rock; next, determines whether the applied gradient magnetic field is offset by detecting the nuclear magnetic resonance signal of the tight reservoir rock and judging whether the type of the nuclear magnetic resonance signal is an echo signal, so as to improve the accuracy and reliability of acquisition of the oil phase nuclear magnetic resonance signal; and finally, if the nuclear magnetic resonance signal is an echo signal, determines that the nuclear magnetic resonance signal is only the oil phase nuclear magnetic resonance signal, and determines the oil content of the tight reservoir rock according to the intensity of the oil phase nuclear magnetic resonance signal, thereby effectively improving the accuracy of the detection result of the oil content of the tight reservoir rock.

The foregoing describes the particular embodiments of the present Specification, and other embodiments fall within the scope of the appended claims. In some cases, the actions or steps recited in the claims can be performed in a different order than in the embodiments and can still achieve the desired results. In addition, the processes depicted in the drawings are not necessarily required to be performed in the illustrated particular order or consecutive order to achieve the desired results. In some embodiments, multitask processing and parallel processing are also possible or may be advantageous.

Although the present application provides the methodical operation steps as illustrated in the embodiments or the flowcharts, it may include more or less operation steps based on the conventional or non-creative labor. The order of the steps listed in the embodiments is merely one of various execution orders of the steps, rather than a unique execution order. At an actual device or client product, the steps may be executed in sequence or in parallel according to the methods illustrated in the embodiments or drawings (e.g., by a parallel processor or under a multi-threaded processing environment).

Any system, apparatus, module or unit set forth in the above embodiments specifically may be implemented by a computer chip or an entity, or by a product having a certain function. A typical implementation device is a computer. Specifically, the computer for example may be any one or combinations of a personal computer, a laptop computer, an on-board man-machine interaction device, a cellular phone, a camera phone, a smart phone, a personal digital assistant, a media player, a navigation device, an email device, a game console, a tablet computer, and a wearable device.

Although the embodiments of the present Specification provide the methodical operation steps as illustrated in the embodiments or the flowcharts, more or less operation steps may be included based on the conventional or non-creative means. The order of the steps listed in the embodiments is merely one of various execution orders of the steps, rather than a unique execution order. At an actual device or client product, the steps may be executed in sequence or in parallel according to the methods illustrated in the embodiments or drawings (e.g., by a parallel processor or under a multi-threaded processing environment and even a distributed data processing environment). The term "comprise", "include" or any other variant intends to cover the non-exclusive inclusions, so that a process, a method, a commodity or a device comprising a series of elements comprise not only those elements, but also other elements not explicitly listed, or further comprise inherent elements of such process, method, commodity or device. In a case where there is no further limitation, it does not exclude other identical or equivalent elements existing in the process, method, commodity or device comprising the elements.

For the convenience of description, herein the apparatus is described by being divided into various modules based on its functions and described respectively. Of course, when the embodiments of the present Specification are implemented, the functions of the various modules may be realized in the same one or more software and/or hardware, or a module that realizes a function may be implemented by a combination of a plurality of submodules or subunits. The apparatus embodiments described above are merely illustrative. For instance, the division of the unit is only a logical function division, and there may be other division manners during actual implementation, e.g., a plurality of units or components may be combined or integrated into another system, or some features may be omitted or not implemented. In addition, the mutual coupling or direct coupling or communication connection shown or discussed may be an indirect coupling or communication connection through some interface, devices or units, and may be electrical, mechanical or in other forms.

As also known to those skilled in the art, in addition to implementing the controller merely with the computer readable program codes, it is completely possible to logically program the methodical steps to enable the controller to realize the same function in the form such as a logic gate, a switch, an application-specific integrated circuit, a programmable logic controller, or an embedded microcontroller. Thus, the controller may be considered as a hardware component, while means included therein for realizing various functions may also be regarded as structures within the hardware component. Or, the means for realizing various functions even may be regarded as either software modules that can implement the method or structures within the hardware component.

The present invention is described with reference to the flowcharts and/or block diagrams of the method, device (system) and computer program product according to the embodiments of the present invention. It shall be appreciated that each flow and/or block in the flowchart and/or block diagram, and the combinations of the flows and/or blocks in the flowchart and/or block diagram can be implemented through computer program instructions. The computer program instructions may be provided to a general computer, a dedicated computer, an embedded processor or a processor of other programmable data processing device, to form a machine so that the instructions, which are executed through the computer or the processor of other programmable data processing device, generate means for realizing the functions specified in one or more flows in the flowchart and/or one or more blocks in the block diagram.

The computer program instructions may also be stored in a computer readable memory which is capable of guiding the computer or other programmable data processing device to work in a specific mode, so that the instructions stored in the computer readable memory generate a manufactured article including instructing means for realizing the functions specified in one or more flows in the flowchart and/or one or more blocks in the block diagram.

The computer program instructions may also be loaded to the computer or other programmable data processing device, so that a series of operation steps can be performed in the computer or other programmable device to generate a processing realized by the computer, thus the instructions executed in the computer or other programmable device provide the steps for realizing the functions specified in one or more flows in the flowchart and/or one or more blocks in the block diagram.

In a typical configuration, the computing device comprises one or more processors (CPUs), an input/output interface, a network interface and a memory.

The memory may have the form of a volatile memory, a Random-Access Memory (RAM) and/or a nonvolatile memory such as Read-Only Memory (ROM) or a flash RAM, etc. among the computer readable medium. The memory is an example of the computer readable medium.

The computer readable medium includes permanent and non-permanent, removable and non-removable media, which can realize the information storage in any method or technique. The information can be computer readable instructions, data structures, program modules or other data. An example of the computer storage medium includes, but not limited to, a phase change memory (PRAM), a static random access memory (SRAM), a dynamic random access memory (DRAM), other types of random access memory (RAM), a read-only memory (ROM), an electrically-erasable programmable read-only memory (EEPROM), a flash memory or other memory techniques, a compact disk read only memory (CD-ROM), a digital versatile disc (DVD) or other optical storages, magnetic cassette tapes, magnetic diskettes or other magnetic storage device or any other non-transmission medium, which can be used for the storage of information accessible to a computing device. According to the definitions herein, the computer readable medium does not include any temporary computer readable media (transitory media), such as modulated data signal and carrier wave.

Those skilled in the art should appreciate that any embodiment of the present Specification can be provided as a method, a system or a computer program product. Therefore, the embodiments of the present Specification can take the form of a full hardware embodiment, a full software embodiment, or an embodiment combining software and hardware. Moreover, the embodiments of the present Specification can take the form of a computer program product implemented on one or more computer usable storage mediums (including, but not limited to, a magnetic disc memory, CD-ROM, optical storage, etc.) containing therein computer usable program codes.

The embodiments of the present Specification may be described in the general context of computer executable instructions executed by the computer, e.g., the program module. In general, the program module includes routine, program, object, component, data structure, etc. executing a particular task or realizing a particular abstract data type. The embodiments of the present Specification may also be put into practice in the distributed computing environments where tasks are executed by remote processing devices connected through a communication network. In the distributed computing environments, the program modules may be located in the local and remote computer storage medium including the storage device.

The embodiments of the present Specification are all described in a progressive manner, and the same or similar portions of the embodiments can refer to each other. Each embodiment lays an emphasis on its distinctions from other embodiments. In particular, the system embodiment is simply described since it is substantially similar to the method embodiment; please refer to the descriptions of the method embodiment for the relevant portion. In the present Specification, the description with reference to the term "one embodiment", "some embodiments", "example", "specific example", or "some examples" and the like means that the specific features, structures, materials, or characteristics described in conjunction with the embodiment(s) or example(s) are included in at least one embodiment or example of the embodiments of the present Specification. Herein, the schematic representations of the above terms are not necessarily directed to the same embodiment or example. In addition, the specific features, structures, materials, or characteristics described may be combined in a suitable manner in any one or more embodiments or examples. Moreover, those skilled in the art can incorporate and combine the different embodiments or examples described herein and the features thereof, without any contradiction to each other.

The above descriptions are just preferred embodiments of the present application, rather than limitations to the present application. For a person skilled in the art, the present application is intended to cover any amendment or variation. Any amendment, equivalent substitution, improvement, etc. made under the spirit and principle of the present application shall fall within the scope of the claims of the present application.

What is claimed is:

1. A method for measuring oil content of a tight reservoir based on nuclear magnetic resonance, comprising:
    a pulse sequence and magnetic field application step:
        applying a pulse sequence to a tight reservoir rock, and after applying a first pulse and a last pulse in the pulse sequence, applying a gradient magnetic field to the tight reservoir rock, respectively, directions of the gradient magnetic field applied twice being opposite to each other, wherein the pulse sequence is composed of three 90° pulses;
    acquiring a nuclear magnetic resonance signal of the tight reservoir rock;
    determining oil content of the tight reservoir rock according to an intensity of the nuclear magnetic resonance signal,
    wherein before determining oil content of the tight reservoir rock according to an intensity of the nuclear magnetic resonance signal, the method includes
        judging whether a type of the nuclear magnetic resonance signal is an echo signal; and
        if yes, determining that the nuclear magnetic resonance signal is an oil phase nuclear magnetic resonance signal.

2. The method for measuring the oil content of the tight reservoir according to claim 1, wherein the pulse sequence and magnetic field application step comprises:
    applying a first 90° pulse to the tight reservoir rock, and applying a first gradient magnetic field to the tight reservoir rock within a preset time period after the first 90° pulse is applied;
    applying a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field;
    applying a third 90° pulse when the oil phase magnetization vector is in the direction of the initial magnetic field and the water phase magnetization vector is turned from an opposite direction of the initial magnetic field of the first axis to the second axis, and applying a second gradient magnetic field to the tight reservoir rock within a preset time period after the third 90° pulse is applied, wherein the first and second gradient magnetic fields have a same intensity and opposite directions.

3. The method for measuring the oil content of the tight reservoir according to claim 2, wherein applying a first 90° pulse to the tight reservoir rock, and applying a first gradient magnetic field to the tight reservoir rock within a preset time period after the first 90° pulse is applied comprises:

applying a first 90° pulse to the tight reservoir rock, so that the oil phase magnetization vector and the water phase magnetization vector are both turned from the opposite direction of the initial magnetic field of the first axis to a same direction of the second axis; and applying a first gradient magnetic field to the tight reservoir rock for a first time duration, within a preset time period after the first 90° pulse is applied, so that the oil phase magnetization vector and the water phase magnetization vector are rotated to positive and negative directions of the second axis, respectively.

4. The method for measuring the oil content of the tight reservoir according to claim 2, wherein applying a second 90° pulse to the tight reservoir rock comprises:

applying a second 90° pulse to the tight reservoir rock and waiting for a second time duration, turning the oil phase magnetization vector and the water phase magnetization vector from the second axis to the direction of the initial magnetic field of the first axis and the opposite direction thereof, respectively, and then turning the water phase magnetization vector from the opposite direction of the initial magnetic field of the first axis to the second axis.

5. The method for measuring the oil content of the tight reservoir according to claim 2, wherein applying a third 90° pulse, and applying a second gradient magnetic field to the tight reservoir rock within a preset time period after the third 90° pulse is applied comprises:

applying a third 90° pulse, so that the oil phase magnetization vector is turned from the direction of the initial magnetic field of the first axis to the second axis, and the water phase magnetization vector is turned from the second axis to the direction of the initial magnetic field of the first axis; and applying a second gradient magnetic field to the tight reservoir rock for a third time duration, within a preset time period after the third 90° pulse is applied, so as to offset the first gradient magnetic field applied to the tight reservoir rock.

6. The method for measuring the oil content of the tight reservoir according to claim 1, wherein determining that the nuclear magnetic resonance signal is an oil phase nuclear magnetic resonance signal comprises:

if the nuclear magnetic resonance signal is an echo signal, determining that an oil phase magnetization vector corresponding to an oil phase substance in the current tight reservoir rock is turned from a second axis to a direction of an initial magnetic field, and then determining that the current nuclear magnetic resonance signal is an oil phase nuclear magnetic resonance signal, wherein the second axis is perpendicular to the direction of the initial magnetic field.

7. The method for measuring the oil content of the tight reservoir according to claim 1, further comprising:

if the nuclear magnetic resonance signal is not an echo signal, determining that the nuclear magnetic resonance signal is composed of a water phase nuclear magnetic resonance signal and an oil phase nuclear magnetic resonance signal;

adjusting at least one of a first time duration, a second time duration, and a third time duration;

wherein, the first time duration is a persistent period of an application of a first gradient magnetic field to the tight reservoir rock, the second time duration is a time interval between a second 90° pulse and a third 90° pulse in the pulse sequence, and the third time duration is a persistent period of an application of a second gradient magnetic field to the tight reservoir rock, the first and second gradient magnetic fields having opposite directions;

and re-executing the pulse sequence and magnetic field application step based on at least one of the first time duration, the second time duration, and the third time duration having been adjusted.

8. The method for measuring the oil content of the tight reservoir according to claim 1, wherein determining oil content of the tight reservoir rock according to an intensity of the nuclear magnetic resonance signal comprises:

acquiring oil content of the tight reservoir rock according to a relationship curve between a preset intensity of the nuclear magnetic resonance signal and the oil content.

9. The method for measuring the oil content of the tight reservoir based on nuclear magnetic resonance according to claim 8, wherein the relationship curve is pre-acquired in the steps of:

determining intensities of nuclear magnetic resonance signals and oil contents of a plurality of tight reservoir rocks with known oil contents linearly fitting the intensities of the nuclear magnetic resonance signals and the oil contents of the tight reservoir rocks, so as to acquire a relationship curve between the intensity of the nuclear magnetic resonance signal and the oil content.

10. The method for measuring the oil content of the tight reservoir based on nuclear magnetic resonance according to claim 7, wherein the first time duration is 0.01 ms to 6 ms.

11. The method for measuring the oil content of the tight reservoir based on nuclear magnetic resonance according to claim 7, wherein the second time duration is 1 ms to 10 ms.

12. The method for measuring the oil content of the tight reservoir based on nuclear magnetic resonance according to claim 7, wherein the third time duration is 0.01 ms to 6 ms.

13. An apparatus for measuring oil content of a tight reservoir based on nuclear magnetic resonance, comprising:

a pulse sequence and magnetic field application module configured to execute a pulse sequence and magnetic field application step: applying a pulse sequence to a tight reservoir rock, and after applying a first pulse and a last pulse in the pulse sequence, applying a gradient magnetic field to the tight reservoir rock, respectively, directions of the applied gradient magnetic field applied twice being opposite to each other, wherein the pulse sequence is composed of three 90° pulses;

a nuclear magnetic resonance signal acquisition module configured to acquire a nuclear magnetic resonance signal of the tight reservoir rock;

a tight reservoir rock oil content determination module configured to determine oil content of the tight reservoir rock according to an intensity of the nuclear magnetic resonance signal;

a signal type judgment unit configured to judge whether a type of the nuclear magnetic resonance signal is an echo signal; and an oil phase nuclear magnetic resonance signal determination unit configured to determine that the nuclear magnetic resonance signal is an oil phase nuclear magnetic resonance signal, if the type of the nuclear magnetic resonance signal is an echo signal.

14. The apparatus for measuring the oil content of the tight reservoir according to claim 13, wherein the pulse sequence and magnetic field application module comprises:

a first 90° pulse application unit configured to apply a first 90° pulse to the tight reservoir rock, and apply a first gradient magnetic field to the tight reservoir rock within a preset time period after the first 90° pulse is applied;

a second 90° pulse application unit configured to apply a second 90° pulse to the tight reservoir rock, when an oil phase magnetization vector corresponding to an oil phase substance and a water phase magnetization vector corresponding to a water phase substance in the tight reservoir rock are in positive and negative directions of a second axis, respectively, wherein the second axis is perpendicular to a first axis that is parallel to a direction of an initial magnetic field;

a third 90° pulse application unit configured to apply a third 90° pulse when the oil phase magnetization vector is in the direction of the initial magnetic field and the water phase magnetization vector is turned from an opposite direction of the initial magnetic field of the first axis to the second axis, and apply a second gradient magnetic field to the tight reservoir rock within a preset time period after the third 90° pulse is applied, wherein the first and second gradient magnetic fields have a same intensity and opposite directions.

15. The apparatus for measuring the oil content of the tight reservoir according to claim 14, wherein the first 90° pulse application unit comprises:

a first pulse application subunit configured to apply a first 90° pulse to the tight reservoir rock, so that the oil phase magnetization vector and the water phase magnetization vector are both turned from the opposite direction of the initial magnetic field of the first axis to a same direction of the second axis;

a first gradient magnetic field application subunit configured to apply a first gradient magnetic field to the tight reservoir rock for a first time duration, within a preset time period after the first 90° pulse is applied, so that the oil phase magnetization vector and the water phase magnetization vector are rotated to positive and negative directions of the second axis, respectively.

16. The apparatus for measuring the oil content of the tight reservoir according to claim 14, wherein the second 90° pulse application unit comprises:

a second pulse application subunit configured to apply a second 90° pulse to the tight reservoir rock and waiting for a second time duration, turn the oil phase magnetization vector and the water phase magnetization vector from the second axis to the direction of the initial magnetic field of the first axis and the opposite direction thereof, respectively, and then turn the water phase magnetization vector from the opposite direction of the initial magnetic field of the first axis to the second axis.

17. The apparatus for measuring the oil content of the tight reservoir according to claim 14, wherein the third 90° pulse application unit comprises:

a third pulse application subunit configured to apply a third 90° pulse, so that the oil phase magnetization vector is turned from the direction of the initial magnetic field of the first axis to the second axis, and the water phase magnetization vector is turned from the second axis to the direction of the initial magnetic field of the first axis;

a second gradient magnetic field application subunit configured to apply a second gradient magnetic field to the tight reservoir rock for a third time duration, within a preset time period after the third 90° pulse is applied, so as to offset the first gradient magnetic field applied to the tight reservoir rock.

18. The apparatus for measuring the oil content of the tight reservoir according to claim 13, wherein the tight reservoir rock oil content determination module comprises:

an oil phase nuclear magnetic resonance signal determination unit configured to, if the nuclear magnetic resonance signal is an echo signal, determine that the oil phase magnetization vector corresponding to the oil phase substance in the current tight reservoir rock is turned from the second axis to the direction of the initial magnetic field, and then determine that the current nuclear magnetic resonance signal is an oil phase nuclear magnetic resonance signal;

wherein the second axis is perpendicular to the direction of the initial magnetic field.

19. The apparatus for measuring the oil content of the tight reservoir according to claim 18, further comprising:

an oil and water mixed signal determination unit configured to, if the nuclear magnetic resonance signal is not an echo signal, determine that the nuclear magnetic resonance signal is composed of a water phase nuclear magnetic resonance signal and an oil phase nuclear magnetic resonance signal;

a time adjustment unit configured to adjust at least one of a first time duration, a second time duration, and a third time duration;

wherein, the first time duration is a persistent period of the application of the first gradient magnetic field to the tight reservoir rock, the second time duration is a time interval between the second 90° pulse and the third 90° pulse in the pulse sequence, and the third time duration is a persistent period of the application of the second gradient magnetic field to the tight reservoir rock, the first and second gradient magnetic fields having opposite directions;

a repeated application unit configured to re-execute the pulse sequence and magnetic field application step based on at least one of the first time duration, the second time duration, and the third time duration having been adjusted.

20. The apparatus for measuring the oil content of the tight reservoir according to claim 13, wherein the tight reservoir rock oil content determination module comprises:

a tight reservoir rock oil content acquiring unit configured to acquire oil content of the tight reservoir rock according to a relationship curve between a preset intensity of the nuclear magnetic resonance signal and the oil content.

21. The apparatus for measuring the oil content of the tight reservoir based on nuclear magnetic resonance according to claim 20, further comprising a relationship curve pre-acquisition module configured to pre-acquire the relationship curve;

the relationship curve pre-acquisition module comprises:

a known data acquisition unit configured to determine intensities of nuclear magnetic resonance signals and oil contents of a plurality of tight reservoir rocks with known oil contents;

a liner fitting unit configured to linearly fit the intensities of the nuclear magnetic resonance signals and the oil contents of the tight reservoir rocks, so as to acquire a relationship curve between the intensity of the nuclear magnetic resonance signal and the oil content.

22. The apparatus for measuring the oil content of the tight reservoir based on nuclear magnetic resonance according to claim 19, wherein the first time duration is 0.01 ms to 6 ms.

23. The apparatus for measuring the oil content of the tight reservoir based on nuclear magnetic resonance according to claim 19, wherein the second time duration is 1 ms to 10 ms.

24. The apparatus for measuring the oil content of the tight reservoir based on nuclear magnetic resonance according to claim 19, wherein the third time duration is 0.01 ms to 6 ms.

25. An electronic device, comprising a memory, a processor, and a computer program stored in the memory and executable in the processor, wherein when executing the computer program, the processor realizes steps of a method for measuring oil content of a tight reservoir based on nuclear magnetic resonance, comprising:
a pulse sequence and magnetic field application step:
applying a pulse sequence to a tight reservoir rock, and after applying a first pulse and a last pulse in the pulse sequence, applying a gradient magnetic field to the tight reservoir rock, respectively, directions of the gradient magnetic field applied twice being opposite to each other, wherein the pulse sequence is composed of three 90° pulses;
acquiring a nuclear magnetic resonance signal of the tight reservoir rock; and
determining oil content of the tight reservoir rock according to an intensity of the nuclear magnetic resonance signal,
wherein before determining oil content of the tight reservoir rock according to an intensity of the nuclear magnetic resonance signal, the method includes
judging whether a type of the nuclear magnetic resonance signal is an echo signal; and
if yes, determining that the nuclear magnetic resonance signal is an oil phase nuclear magnetic resonance signal.

26. A computer readable storage medium which stores a computer program, wherein when being executed by a processor, the computer program realizes steps of a method for measuring the oil content of the tight reservoir based on nuclear magnetic resonance, comprising:
a pulse sequence and magnetic field application step:
applying a pulse sequence to a tight reservoir rock, and after applying a first pulse and a last pulse in the pulse sequence, applying a gradient magnetic field to the tight reservoir rock, respectively, directions of the gradient magnetic field applied twice being opposite to each other, wherein the pulse sequence is composed of three 90° pulses;
acquiring a nuclear magnetic resonance signal of the tight reservoir rock; and
determining oil content of the tight reservoir rock according to an intensity of the nuclear magnetic resonance signal,
wherein before determining oil content of the tight reservoir rock according to an intensity of the nuclear magnetic resonance signal, the method includes
judging whether a type of the nuclear magnetic resonance signal is an echo signal; and
if yes, determining that the nuclear magnetic resonance signal is an oil phase nuclear magnetic resonance signal.

27. A system for measuring the oil content of the tight reservoir based on nuclear magnetic resonance, comprising a control component, and a nuclear magnetic resonance spectrometer communicatively connected to the control component;
the nuclear magnetic resonance spectrometer is provided therein with a sample compartment that contains a tight reservoir rock;
the control component is configured to send a control signal to the nuclear magnetic resonance spectrometer;
the nuclear magnetic resonance spectrometer executes a pulse sequence and a magnetic field application step on the tight reservoir rock according to the control signal:
applying a pulse sequence to a tight reservoir rock, and after applying a first pulse and a last pulse in the pulse sequence, applying a gradient magnetic field to the tight reservoir rock, respectively, directions of the gradient magnetic field applied twice being opposite to each other, wherein the pulse sequence is composed of three 90° pulses; acquiring a nuclear magnetic resonance signal of the tight reservoir rock; sending the nuclear magnetic resonance signal to the control component;
the control component is further configured to determine oil content of the tight reservoir rock according to an intensity of the nuclear magnetic resonance signal,
wherein the control component is further configured to judge whether a type of the nuclear magnetic resonance signal is an echo signal; and if the nuclear magnetic resonance signal is the echo signal, determine that the nuclear magnetic resonance signal is an oil phase nuclear magnetic resonance signal, and determine the oil content of the tight reservoir rock according to the intensity of the oil phase nuclear magnetic resonance signal.

28. The system for measuring the oil content of the tight reservoir according to claim 27, wherein the control component comprises a processor and a controller communicatively connected to each other;
the processor sends a control signal to the nuclear magnetic resonance spectrometer via the controller, receives a nuclear magnetic resonance signal sent by the nuclear magnetic resonance spectrometer, and judges whether a type of the nuclear magnetic resonance signal is an echo signal;
if the nuclear magnetic resonance signal is the echo signal, determines that the nuclear magnetic resonance signal is an oil phase nuclear magnetic resonance signal, and determines the oil content of the tight reservoir rock according to the intensity of the oil phase nuclear magnetic resonance signal.

29. The system for measuring the oil content of the tight reservoir according to claim 27, wherein the sample compartment comprises a rock receiving cavity configured to contain the tight reservoir rock, and an electromagnetic coil disposed outside the rock receiving cavity;
the electromagnetic coil is configured to apply the pulse sequence to the tight reservoir rock in the rock receiving cavity, and acquire a nuclear magnetic resonance signal of the tight reservoir rock.

30. The system for measuring the oil content of the tight reservoir according to claim 29, wherein the sample compartment further comprises a temperature control component in communication with the rock receiving cavity and configured to change a temperature in the rock receiving cavity.

31. The system for measuring the oil content of the tight reservoir according to claim 27, wherein the nuclear magnetic resonance spectrometer comprises a magnet configured to apply a gradient magnetic field to the tight reservoir rock.

\* \* \* \* \*